(12) United States Patent
Ko et al.

(10) Patent No.: US 11,114,397 B2
(45) Date of Patent: Sep. 7, 2021

(54) SEMICONDUCTOR PACKAGE SUBSTRATE AND METHOD OF MANUFACTURING SEMICONDUCTOR PACKAGE USING THE SAME

(71) Applicant: SAMSUNG ELECTRONICS CO., LTD., Suwon-si (KR)

(72) Inventors: Tae Ho Ko, Suwon-si (KR); Dae Hee Lee, Suwon-si (KR); Hyun Chul Jung, Suwon-si (KR); Myeong Ho Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/663,735

(22) Filed: Oct. 25, 2019

(65) Prior Publication Data
US 2020/0312801 A1 Oct. 1, 2020

(30) Foreign Application Priority Data
Mar. 28, 2019 (KR) .................. 10-2019-0035866

(51) Int. Cl.
*H01L 23/00* (2006.01)
*H01L 23/31* (2006.01)
*H01L 23/498* (2006.01)
*H01L 21/52* (2006.01)
*H01L 21/56* (2006.01)

(52) U.S. Cl.
CPC .............. *H01L 24/05* (2013.01); *H01L 21/52* (2013.01); *H01L 21/563* (2013.01); *H01L 23/3171* (2013.01); *H01L 23/3192* (2013.01); *H01L 23/49861* (2013.01); *H01L 24/03* (2013.01); *H01L 2224/02371* (2013.01); *H01L 2224/28105* (2013.01)

(58) Field of Classification Search
CPC ....... H01L 24/05; H01L 21/52; H01L 21/563; H01L 23/3171; H01L 23/3192; H01L 23/49861; H01L 24/03
See application file for complete search history.

(56) References Cited

U.S. PATENT DOCUMENTS

| 10,366,966 | B1* | 7/2019 | Wan | .................. | H01L 25/50 |
| 2010/0059854 | A1* | 3/2010 | Lin | .................. | H01L 25/50 |
| | | | | | 257/528 |
| 2013/0187275 | A1* | 7/2013 | Ohira | .................. | H01L 24/13 |
| | | | | | 257/758 |

(Continued)

FOREIGN PATENT DOCUMENTS

KR 10-2017-0108322 A 9/2017
KR 10-2018-0024834 A 3/2018

*Primary Examiner* — Nathan W Ha
(74) *Attorney, Agent, or Firm* — Sughrue Mion, PLLC

(57) ABSTRACT

Provided in a semiconductor package substrate including a semiconductor chip including a connection pad, an encapsulant encapsulating at least a portion of the semiconductor chip, a connection member disposed on the semiconductor chip and the encapsulant, the connection member including a redistribution layer that is electrically connected to the connection pad, a first passivation layer disposed on the connection member, and an adhesive layer disposed on at least one of a top surface of the encapsulant and a bottom surface of the first passivation layer in a region outside of the semiconductor chip.

18 Claims, 22 Drawing Sheets

(56) References Cited

U.S. PATENT DOCUMENTS

| | | | |
|---|---|---|---|
| 2014/0239508 A1* | 8/2014 | Ichikawa | H01L 24/05 257/774 |
| 2016/0079191 A1* | 3/2016 | Chen | H01L 23/3142 257/773 |
| 2017/0092604 A1* | 3/2017 | Hsieh | H01L 25/105 |
| 2018/0061794 A1 | 3/2018 | Kim et al. | |
| 2018/0337143 A1* | 11/2018 | Lu | H01L 24/17 |
| 2019/0157208 A1* | 5/2019 | Lin | H01L 24/20 |
| 2020/0006278 A1* | 1/2020 | Wang | H01L 24/33 |

* cited by examiner

SEMICONDUCTOR PACKAGE SUBSTRATE AND METHOD OF MANUFACTURING SEMICONDUCTOR PACKAGE USING THE SAME

CROSS-REFERENCE TO THE RELATED APPLICATION(S)

This application claims priority from Korean Patent Application No. 10-2019-0035866 filed on Mar. 28, 2019 in the Korean Intellectual Property Office, the disclosure of which is incorporated herein by reference in its entirety.

BACKGROUND

Example embodiments of the present disclosure relate to a semiconductor package substrate, for example, a semiconductor package substrate for manufacturing a fan-out semiconductor package and a method of manufacturing a semiconductor package using the semiconductor package substrate.

In terms of form, there has been continuous demand for light, thin, short, and small semiconductor packages. In terms of function, there has been continuous demand for a system in package (SiP), requiring complexation and multifunctionality. One type of package technology, suggested to satisfy the above technical demands, is a fan-out semiconductor package. Such a fan-out semiconductor package has a compact size and may allow a plurality of pins to be implemented by redistributing connection terminals outwardly of a region in which a semiconductor chip is disposed.

In such a package, a redistribution layer is also formed on a backside of a semiconductor chip to improve circuit processing speed and to achieve a thinner package. Accordingly, there is demand for a technique to form such a backside redistribution layer to have a fine pattern without defects.

SUMMARY

One or more example embodiments provide a semiconductor package substrate, in which a thickness of an encapsulant may be significantly reduced to form a backside redistribution layer to have a fine pattern, and a method of manufacturing a semiconductor package using the semiconductor package substrate.

One or more example embodiments provide a semiconductor package substrate, in which a thickness of an encapsulant is significantly reduced using a carrier substrate having a portion to which an adhesive layer is applied.

According to an aspect of an example embodiment, there is provided a semiconductor package substrate including a semiconductor chip including a connection pad, an encapsulant encapsulating at least a portion of the semiconductor chip, a connection member disposed on the semiconductor chip and the encapsulant, the connection member including a redistribution layer that is electrically connected to the connection pad, a first passivation layer disposed on the connection member, and an adhesive layer disposed on at least one of a top surface of the encapsulant and a bottom surface of the first passivation layer in a region outside of the semiconductor chip.

According to an aspect of an example embodiment, there is provided a method of manufacturing a semiconductor package, the method including disposing a semiconductor chip in a through-portion of a frame, the semiconductor chip including a connection pad, forming an encapsulant to encapsulate at least a portion of the semiconductor chip, bonding a carrier substrate, to which an adhesive layer is disposed, to the encapsulant, disposing a connection member on a second surface of the semiconductor chip opposing a first surface the semiconductor chip that faces the carrier substrate, the connection member including a redistribution layer that is electrically connected to the connection pad, and removing the carrier substrate such that the adhesive layer remains on the encapsulant.

According to an aspect of an example embodiment, there is provided a method of manufacturing a semiconductor package, the method including disposing a semiconductor chip in a through-portion of a frame, the semiconductor chip including a connection pad, disposing an encapsulant to encapsulate at least a portion of the semiconductor chip, disposing a connection member, including a redistribution layer electrically connected to the connection pad, on the semiconductor chip, disposing a passivation layer on a second surface of the connection member that opposes a first surface the connection member, the first surface of the connection member facing the semiconductor chip, disposing a carrier substrate, to which an adhesive layer is attached, on the passivation layer, disposing a backside redistribution layer, electrically connected to the connection pad, on the encapsulant on a fourth surface of the semiconductor chip opposing a third surface of the semiconductor chip, the connection member being disposed on the third surface of the semiconductor chip, and removing the carrier substrate such that the adhesive layer remains on the second surface of the connection member.

BRIEF DESCRIPTION OF DRAWINGS

The above and/or other aspects, features, and advantages of the present disclosure will be more clearly understood from the following detailed description, taken in conjunction with the accompanying drawings, in which.

DETAILED DESCRIPTION

Figure 1:
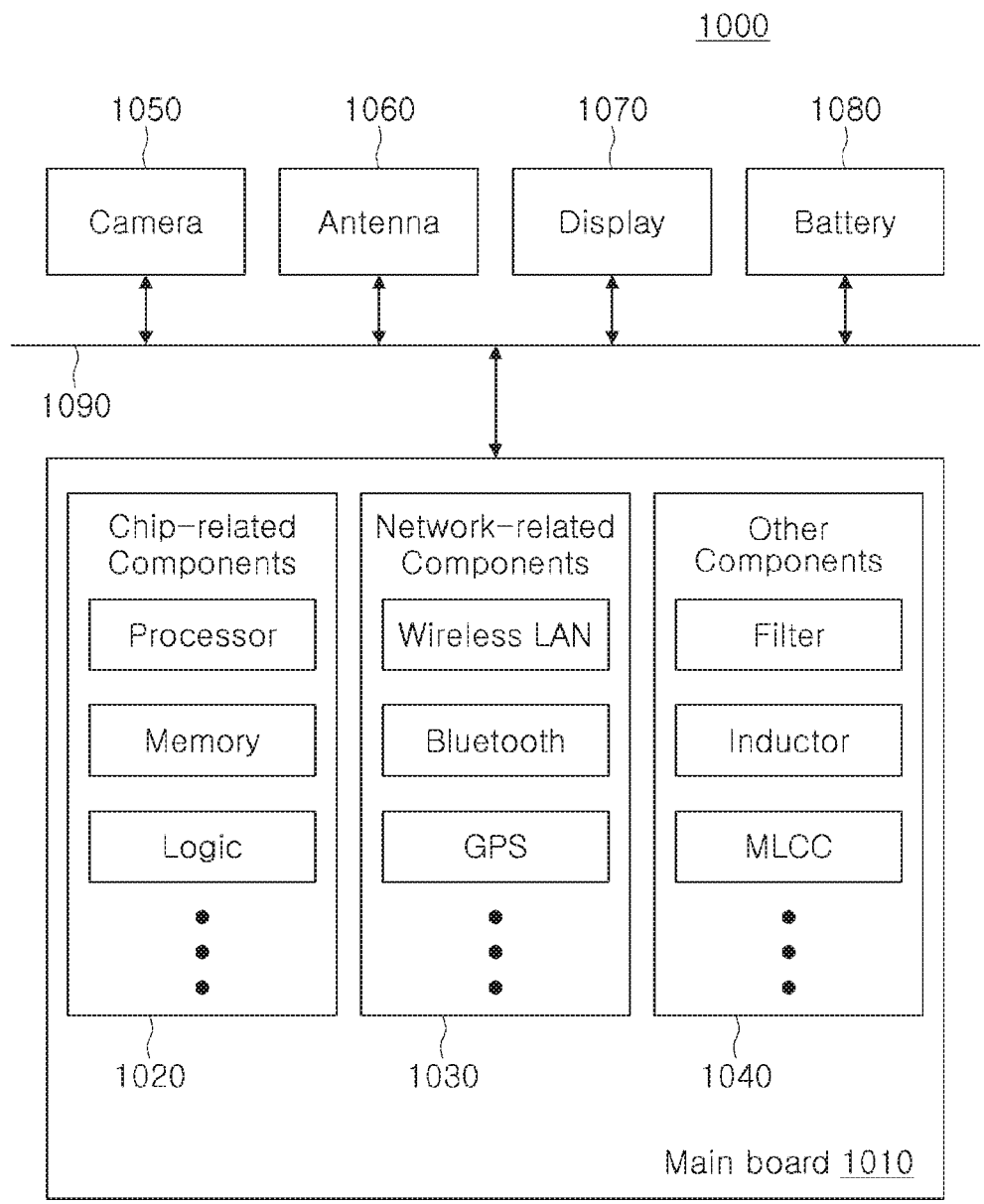
FIG. 1 is a block diagram schematically illustrating an example of an electronic device system.

Hereinafter, embodiments of the present disclosure will be described as follows with reference to the attached drawings. FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other components as described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like, an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive component, or the like. However, the electronic device 1000 is not limited thereto, but may be any other electronic device processing data.

Figure 2:
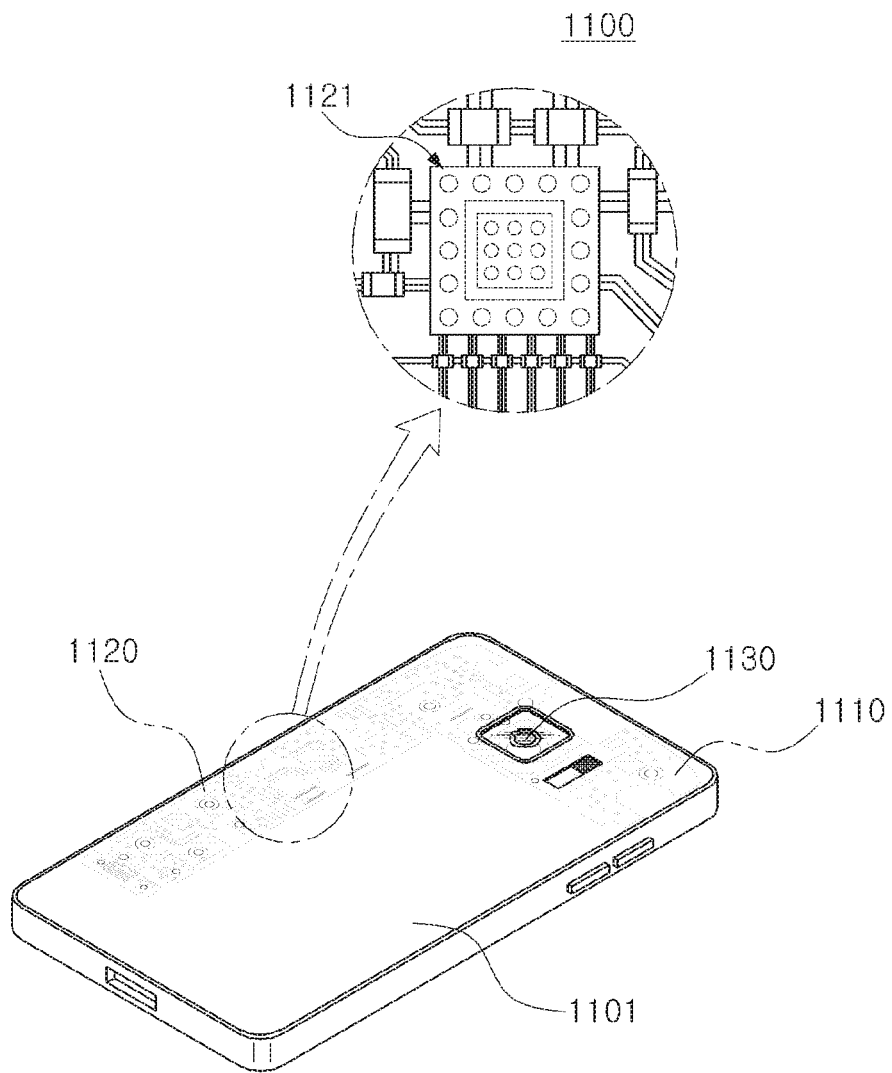
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. For example, a size of connection pads of the semiconductor chip and an interval between the connection pads of the semiconductor chip may be very fine, but a size of component mounting pads of the mainboard used in the electronic device and an interval between the component mounting pads of the mainboard may be significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Figure 3A:
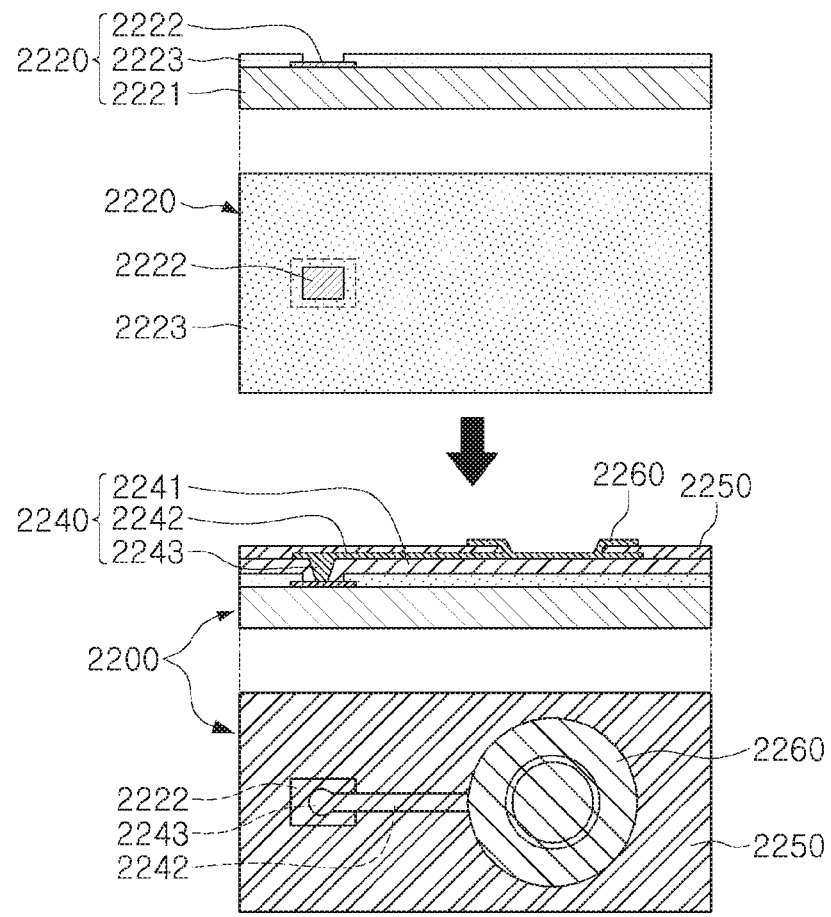
FIGS. 3A and 3B are schematic cross-sectional views illustrating states of a fan-in semiconductor package before and after being packaged.
Figure 3B:
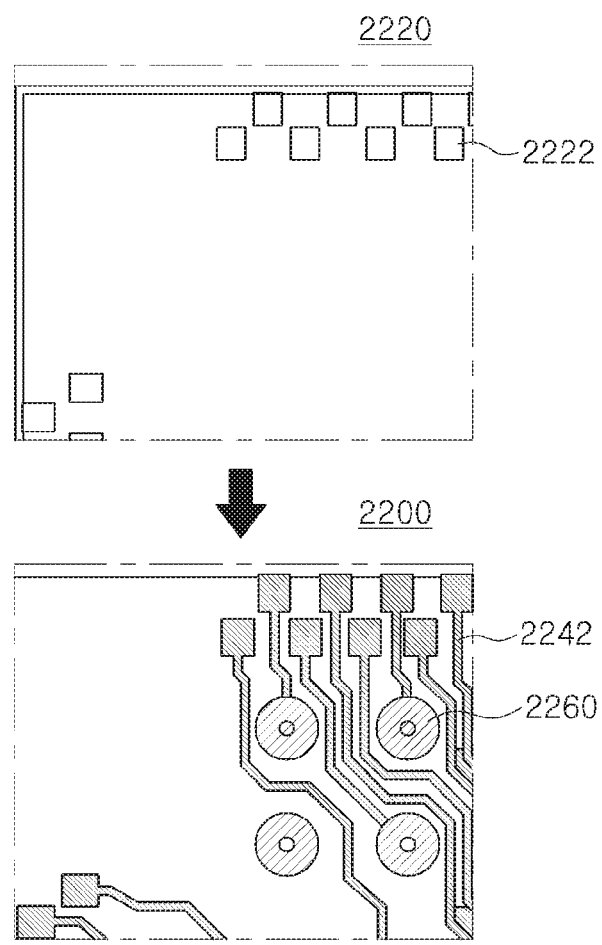

FIGS. 3A and 3B are schematic cross-sectional views illustrating states of a fan-in semiconductor package before and after being packaged.

Figure 4:
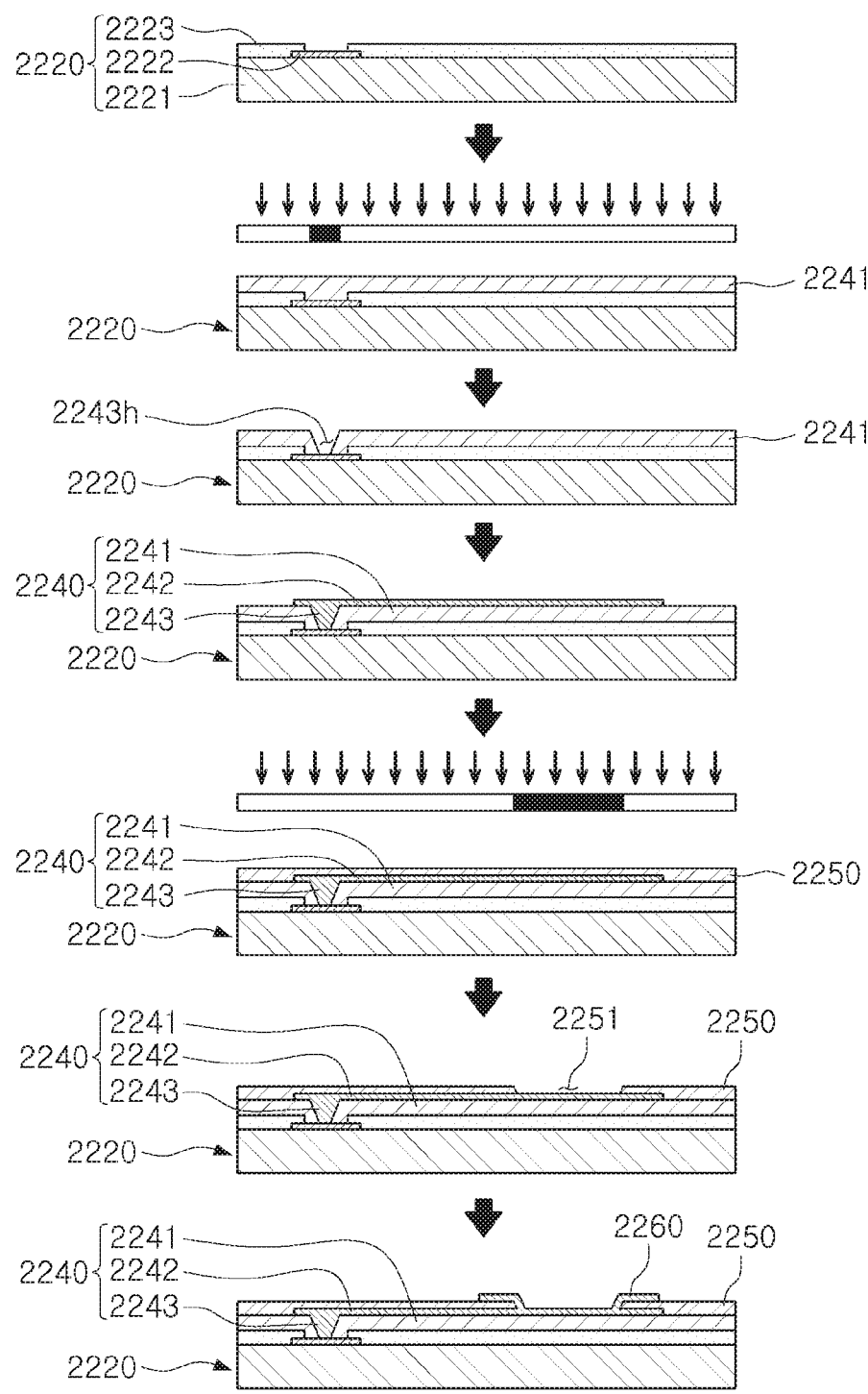
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A, 3B, and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260 or the like, may be formed on the opening 2251. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have high electrical characteristics and may be produced at a relatively low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not large enough to directly mount the fan-in semiconductor package on the mainboard of the electronic device.

Figure 5:
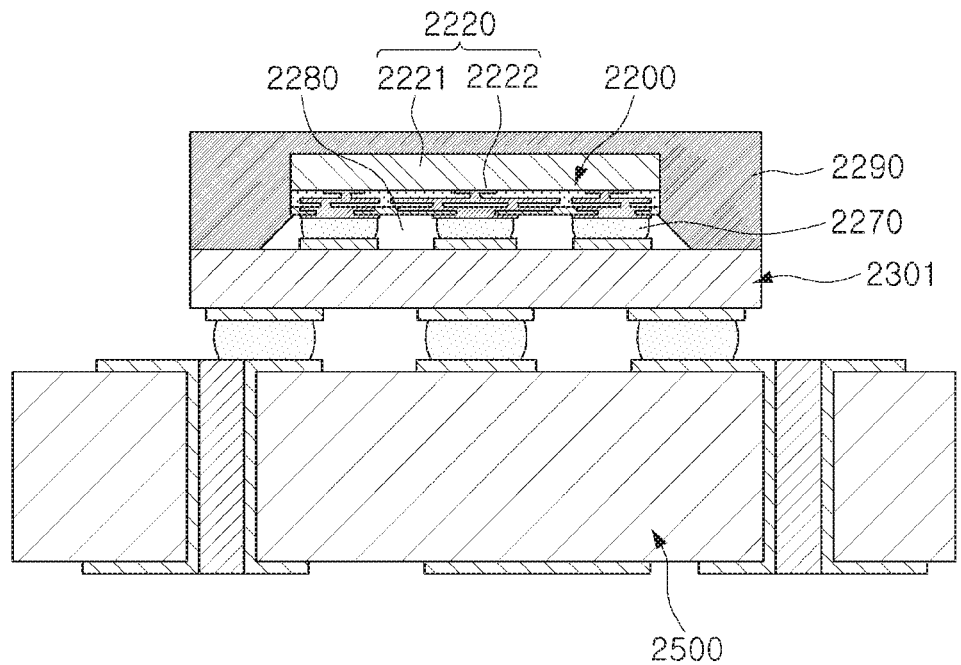
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a fan-in semiconductor package mounted on a ball grid array (BGA) substrate and is ultimately mounted on a mainboard of an electronic device.

Figure 6:
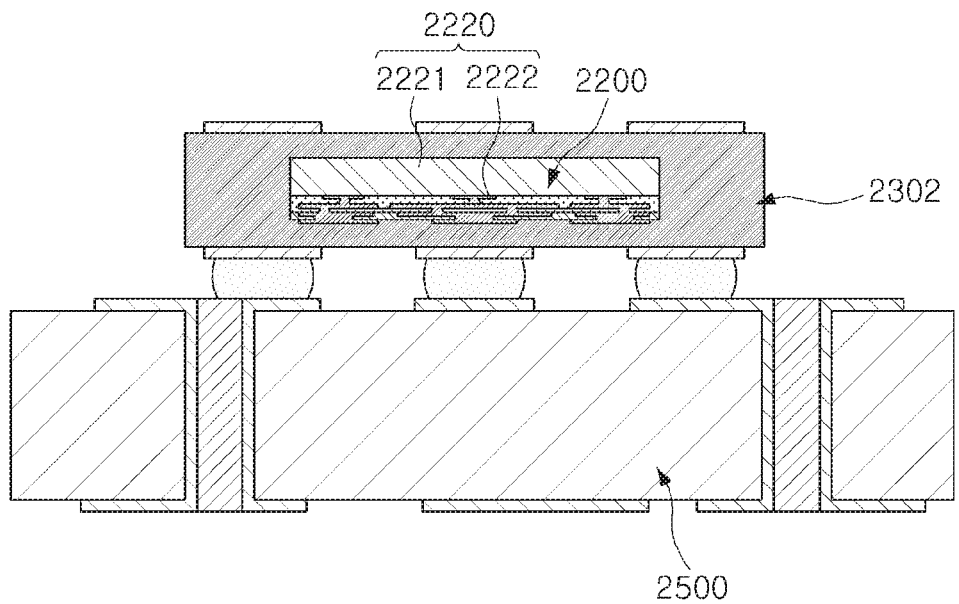
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a fan-in semiconductor package is embedded in a BGA substrate and is ultimately mounted on a mainboard of an electronic device.

Referring to FIG. 5, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Referring to FIG. 6, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate, and then may be mounted on the mainboard of the electronic device through a packaging process or may be mounted and used on the mainboard of the electronic device in a state in which it is embedded in the BGA substrate.

Figure 7:
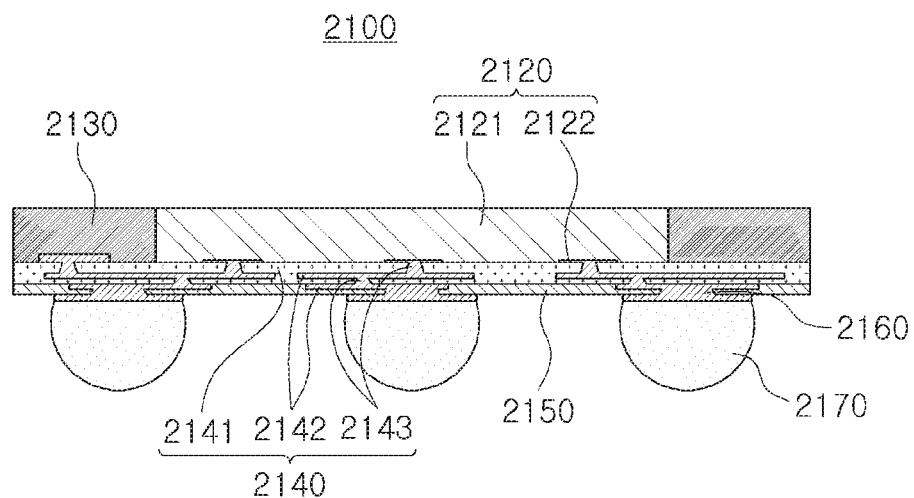
FIG. 7 is a schematic cross-sectional view illustrating a fan-out semiconductor package according to an example embodiment.

FIG. 7 is a schematic cross-sectional view illustrating a fan-out semiconductor package according to an example embodiment.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer, and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly from the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. The fan-out semiconductor package has the form in which the I/O terminals of the semiconductor chip are redistributed and disposed outwardly from the semiconductor chip through the connection member formed on the semiconductor chip as described above. Therefore, even in a case in which a size of the semiconductor chip is decreased, a standardized ball layout may be used in the fan-out semiconductor package as is, such that the fan-out semiconductor package may be mounted on the mainboard of the electronic device without using a separate BGA substrate, as described below.

Figure 8:
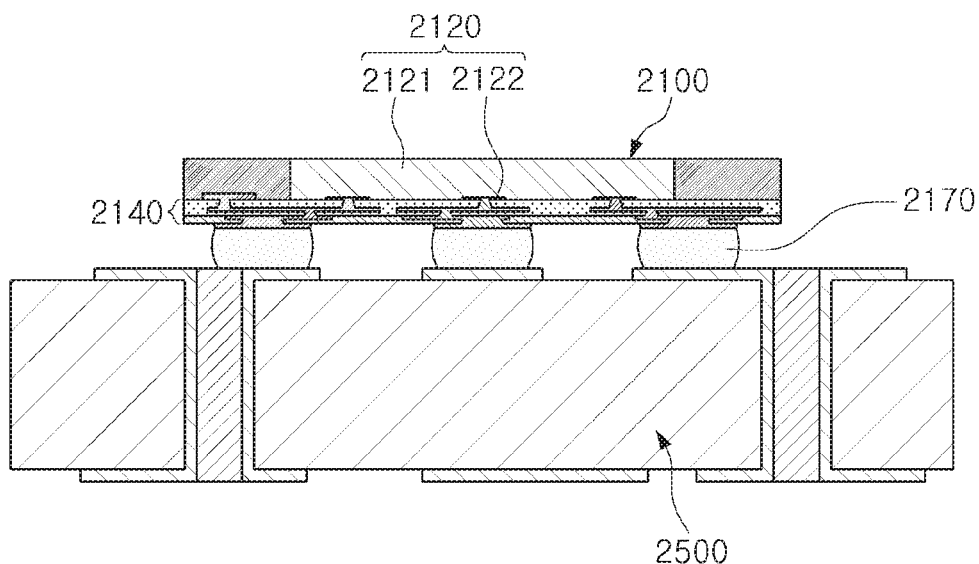
FIG. 8 is a schematic cross-sectional view illustrating a fan-out semiconductor package mounted on a mainboard of an electronic device according to an example embodiment.

FIG. 8 is a schematic cross-sectional view illustrating a fan-out semiconductor package mounted on a mainboard of an electronic device according to an example embodiment.

Referring to FIG. 8, a fan-out semiconductor package 2100 may be mounted on a mainboard 2500 of an electronic device through solder balls 2170, or the like. For example, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has high thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Hereinafter, a package substrate structure, in which a thickness of an encapsulant may be significantly reduced and a backside redistribution layer may be formed to have a fine pattern without defects, will be described with reference to accompanying drawings.

Figure 9A:
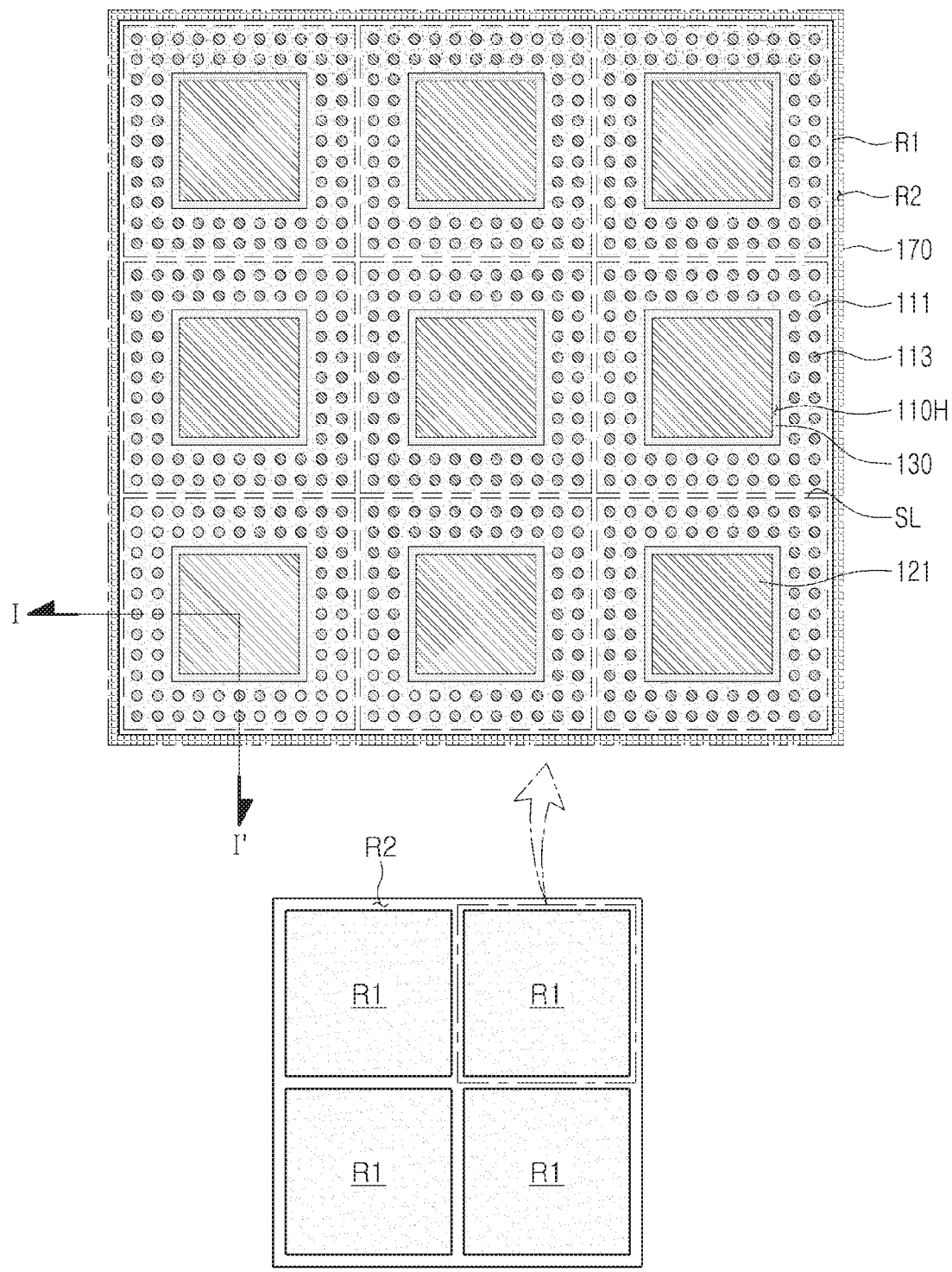
FIGS. 9A to 9C are plan views illustrating a semiconductor package substrate according to an example embodiment.
Figure 9B:
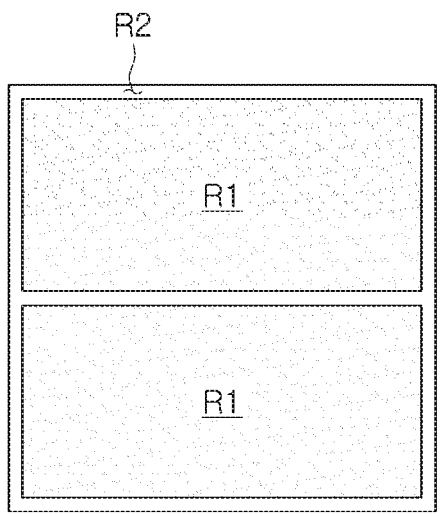
Figure 9C:
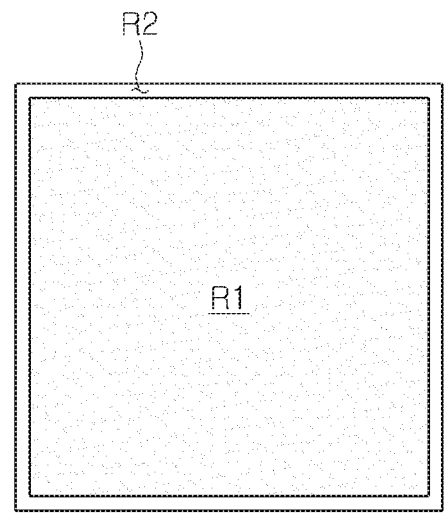
Figure 10:
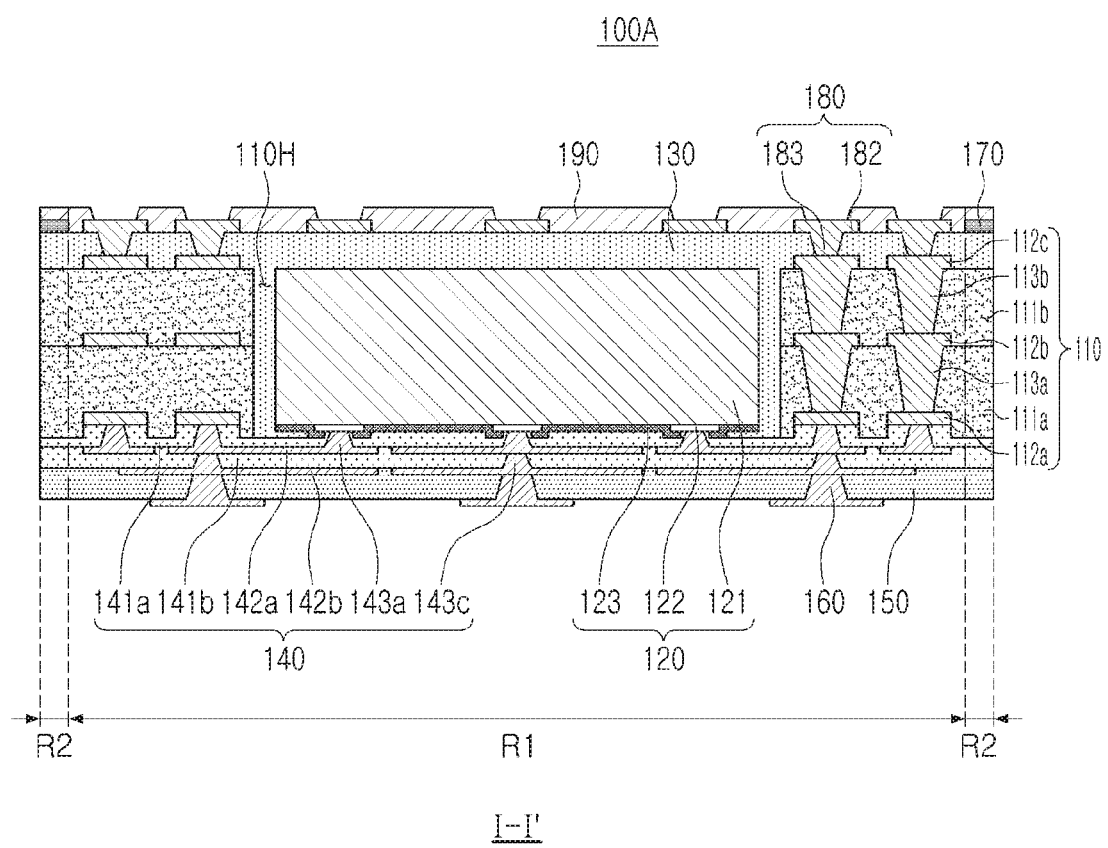
FIG. 10 is a schematic cross-sectional view taken along line I-I' of FIG. 9A.

FIGS. 9A to 9C are plan views illustrating a semiconductor package substrate according to an example embodiment, and FIG. 10 is a schematic cross-sectional view taken along line I-I' of FIG. 9A.

Referring to FIGS. 9A to 9C and FIG. 10, a semiconductor package substrate 100A according to an example embodiment includes a frame 110 having a through-hole 110H, a semiconductor chip 120 having a connection pad 122, an encapsulant 130 covering at least a portion of the semiconductor chip 120, a connection member 140, disposed on the semiconductor chip 120 and the encapsulant 130, including redistribution layers 142a and 142b electrically connected to the connection pad 122, an adhesive layer 170 disposed on a top surface of the encapsulant 130 and in a region outside of the semiconductor chip 120, a backside connection member 180 including at least one backside redistribution layer 182 disposed on the encapsulant 130, a first passivation layer 150 disposed on the connection member 140, a first underbump metal layer 160 disposed on an opening of the first passivation layer 150, and a second passivation layer 190 disposed on the backside connection member 180. The semiconductor package substrate 100A may further include an electrical connection metal on the underbump metal layer 160. The electrical connection metal will be described later with reference to FIG. 11D.

The semiconductor package substrate 100A may be manufactured as a plurality of semiconductor packages by a singulation process. Accordingly, the semiconductor package substrate 100A may have a shape in which a plurality of semiconductor package substrates, each having a shape illustrated in FIG. 10, are repeatedly connected to each other on a plane. The semiconductor package substrate 100A has a first region R1, including a region in which the semiconductor chip 120 is disposed, and a second region R2 surround the first region R1. The first region R1 may be a chip region, substantially constituting a semiconductor package, and the second region R2 is a dummy region which is not ultimately included in the semiconductor package or does not perform electrical functions in the semiconductor package.

As illustrated in FIG. 9A, the semiconductor package 100A includes one or more first regions R1 divided by the second region R2. Each of the first regions R1 includes a plurality of package regions constituting a semiconductor package. Tens to hundreds of the package regions may be included in a single first region R1, depending on embodiments, but the number of the included package regions is not limited thereto. Accordingly, the first region R1 may further include a scribe line region SL corresponding to a boundary between the package regions. The semiconductor package substrate 100A may refer to a single first region R1 and a second region R2 surrounding the first region R1, or may refer to an entire panel including a plurality of first regions R1 and a second region R2 surrounding the plurality of first regions R1.

The adhesive layer 170 is disposed on a top surface of the encapsulant 130 in the second region R2 of the semiconductor package substrate 100A. As illustrated in FIG. 9A, the adhesive layer 170 may have a shape of a rectangular ring surrounding the semiconductor chip 120 along the second region R2 on outside of the semiconductor chip 120 on a plane. According to the semiconductor package substrate 100A, the second region R2 may have a shape in which a plurality of rectangular rings, for example, four rectangular rings or two rectangular rings, are connected, as illustrated in FIGS. 9A and 9B, or a shape of a single rectangular ring, as illustrated in FIG. 9C. In each case, the adhesive layer 170 may also be disposed to have a shape in which a plurality of rectangular rings are connected along the second region R2, or to have a shape of a single rectangular ring along an outermost second region R2. For example, the adhesive layer 170 may be disposed in at least a portion of the second region R2. The adhesive layer 170 may be disposed parallel to the backside redistribution layer 182 at the same or similar level as the backside redistribution layer 182. The adhesive layer 170 may include an epoxy-based resin and may be, in detail, a no flow resin (NFR) layer. For example, the adhesive layer 170 may be, as a resin having a flow rate of resin of 1 mm or less, a material having little flowability of the resin during thermocompression and may be prepared by press working or the like in a shape corresponding to the second region R2.

During a process of manufacturing the semiconductor package substrate 100A, the encapsulant 130 is formed to cover the semiconductor chip 120, and then a carrier substrate is used to support the substrate, which is being manufactured, when the connection member 140 is formed. While using a detach core as the carrier substrate, after an Ajinomoto Build-up Film (ABF) or the like is applied to prevent detachment of a copper layer, constituting the detach core, the carrier substrate is attached to the encapsulant 130. Even after detachment of the carrier substrate, the ABF remains and constitutes a portion of the encapsulant 130 to increase a thickness of the encapsulant 130. Since a size of a package itself is increased as the thickness of the encapsulant 130 is increased and a size of the backside via 183, penetrating through the encapsulant 130, should be increased, it is difficult to form the backside connection member 180 to have a fine pattern and a defect such as a via dimple occurs. In addition, since it is disadvantageous in terms of heat dissipation, the thickness of the encapsulant 130 needs to be significantly decreased.

In the case of the semiconductor package 100A according to the example embodiment, a no flow resin (NFR) is used as the adhesive layer 170, rather than an ABF, and remains only in the second region R2 to decrease the thickness of the encapsulant 130 by, for example, about 10 micrometers to about 20 micrometers. Thus, the backside connection member 180 may be formed to have a more fine pattern.

Hereinafter, the respective components, included in the semiconductor package 100A according to an example embodiment, will be described in detail.

The frame 110 has a through-portion 110H, having a through-hole shape, and the semiconductor chip 120 is disposed in the through-portion 110H in such a manner that a surface, on which the connection pad 122 is disposed, faces a top surface of the connection member 140. In this case, the connection pad 122 may be connected to a first connection via 143a of the connection member 140 without an additional bump. The frame 110 includes a first insulating layer 111a disposed in contact with the top surface of the connection member 111a, a first wiring layer 112a disposed in contact with the top surface of the connection member 140 and embedded in the first insulating layer 111a, a second wiring layer 112b disposed on a side of the first insulating layer 111a opposing a side in which the first wiring layer 112a is embedded, a second insulating layer 111b, disposed on the side of the first insulating layer 111a opposing the side in which the first wiring layer 112a is embedded, covering at least a portion of the second wiring layer 112b, a third wiring layer 112c disposed on a side of the second insulating layer 111b opposing a side in which the second wiring layer 112b is embedded, a first wiring via layer 113a penetrating through the first insulating layer 111a and electrically connecting the first wiring layer 112a and the second wiring layer 112b to each other, and a second wiring via layer 113b penetrating through the second insulating layer 111b and electrically connecting the second wiring layer 112b and the third wiring layer 112c to each other. The frame 110 may serve as a support member.

The first wiring layer 112a may be recessed into the first insulating layer 111a. For example, a surface, disposed in contact with the top surface of the connection member 140 of the first insulating layer 111a, may have a step with respect to a surface disposed in contact with a top surface of the connection member 140 of the first wiring layer 112a. In this case, when the first semiconductor chip 120 and the frame 110 are encapsulated using the encapsulant 130, bleeding of an encapsulant material may be suppressed to prevent the first wiring layer 112a from being contaminated by the encapsulant material. Each of the first wiring layer 112a, the second wiring layer 112b, and the third wiring layer 112c may have a thickness greater than a thickness of each of the redistribution layers 142a and 142b.

When a hole for the first wiring via layer 113a is formed, some pads of the first wiring layer 112a may serve as a stopper. A wiring via of each of the first wiring via layers 113a may have a tapered shape in which an upper side has a width greater than a width of a lower side. In this case, the wiring via of the first wiring via layer 113a may be integrated with a pattern of the second wiring layer 112b. Similarly, when a hole for the second wiring via layer 113b is formed, some pads of the second wiring layer 112b may serve as a stopper. A wiring via of the second wiring via layer 113b may have a tapered shape in which an upper side has a width greater than a width of a lower side. In this case, a wiring via of the second wiring via layer 113b may be integrated with a pad pattern of the third wiring layer 112c.

A material of the first insulating layer 111a and the second insulating layer 111b may be an insulating layer. The insulating layer may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like.

The first wiring layer 112a, the second wiring layer 112b, and the third wiring layer 112c may serve to redistribute the connection pad 122 of the semiconductor chip 120, and may serve to provide a pad pattern for the first wiring via layer 113a and the second wiring via layer 113b to connect upper and lower portions of the package substrate 100A. The first wiring layer 112a, the second wiring layer 112b, and the third wiring layer 112c may be formed of a conductive material such as copper (Cu), aluminum (Al), silver (Ag), tin (Sn), gold (Au), nickel (Ni), lead (Pb), titanium (Ti), or alloys thereof. The first wiring layer 112a, the second wiring layer 112b, and the third wiring layer 112c may include ground (GND) patterns, power (PWR) patterns, signal (S) patterns, and the like. The signal (S) patterns may include various signals except for the ground (GND) patterns, the power (PWR) patterns, and the like, such as a data signal, and the like. The term "pattern" refers to a concept including a wiring and a pad.

The first wiring layer 113a and the second wiring via layer 113b electrically connect the first wiring layer 112a, the second wiring layer 112b, and the third wiring layer 112c, disposed on different layers, to form an electrical path in the first frame 110. In addition, the first via wiring layer 113a and the second via wiring layer 113b form an electrical path between the connection member 140 and the electrical connection metal 195. The first via wiring layer 113a and the second via wiring layer 113b may be formed of a metal material. Each of the first via wiring layer 113a and the second via wiring layer 113b may be a filled via, filled with a metal material, or a conformal via in which a metal material is formed along a wall surface of a via hole. Each of the first via wiring layer 113a and the second via wiring layer 113b may have a tapered shape. The first via wiring layer 113a and the second via wiring layer 113b may be integrated with at least portions of the first wiring layer 112a, the second wiring layer 112b, and the third wiring layer 112c, but the integration thereof is not limited thereto.

The semiconductor chip 120 may be an integrated circuit (IC) provided in an amount of several hundred to several million or more elements integrated in a single chip. The semiconductor chip 120 may be a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP), but is not limited thereto. The semiconductor chip 120 may be a logic chip such as an analog-to-digital converter, an application-specific IC (ASIC), or the like, or a memory chip such as a volatile memory (for example, a DRAM), a nonvolatile memory (for example, a ROM or a flash memory), or the like, but is not limited thereto. In addition, the above components may be disposed after being combined with each other.

The semiconductor chip 120 may have an active surface, on which the connection pad 122 is disposed, and an inactive surface opposing the active surface. The semiconductor chip may be formed based on an active wafer. A base material of a body 121 may be silicon (Si), germanium (Ge), gallium arsenide (GaAs), or the like. Various circuits may be formed on the body 121. The connection pad 122 may be provided to electrically connect the semiconductor chip to another component. The connection pads 122 may be formed of a conductive material such as aluminum (Al) or the like, but a material of the connection pad 122 is not limited thereto. A passivation layer 123 may be further formed on the body 121 to expose the connection pad 122. The passivation layer 123 may be an oxide layer, a nitride layer, or the like, or a double layer of an oxide layer and a nitride layer.

The encapsulant 130 may protect the frame 110, the semiconductor chip 120, and the like. An encapsulation form of the encapsulant 130 is not limited. For example, the encapsulant 130 may cover at least a portion of the frame 110 and at least a portion of the inactive surface of the semiconductor chip 120, and may fill at least a portion of a space between a wall surface of the through-portion 110H and a side surface of the semiconductor chip 120. The encapsulant 130 may fill the through-portion 110H to serve as an adhesive for fixing the semiconductor chip 120, depending on a detailed material, and to reduce buckling. The encapsulant 130 includes an insulating material. The insulating material may be a thermosetting resin such as an epoxy resin, a thermoplastic resin such as a polyimide resin, or a resin including a reinforcing material such as an inorganic filler, for example, silica, alumina, or the like, more specifically, ABF, FR-4, BT, and the like. The insulating material may be a molding material such as an epoxy molding component (EMC). The insulating material may be a photosensitive material, for example, a photoimageable encapsulant (PIE), or may be a material in which a thermosetting resin or a thermoplastic resin is impregnated together with an inorganic filler in a core material such as a glass fiber (or a glass cloth or a glass fabric) or the like.

The connection member 140 may redistribute the connection pad 122 of the semiconductor chip 120. Connection pads 122 of tens to hundreds of semiconductor chips 120, having various functions, may be distributed through the connection member 140, and may be physically and/or electrically connected to an external component through electrical connection metals, attached to a lower portion of a semiconductor package, depending on the functions in a subsequent process. The connection member 140 includes a first insulating layer 141a disposed on the frame 110 and the active surface of the semiconductor chip 120, a first redistribution layer 142a disposed on the first insulating layer 141a, a first connection via 143a penetrating through the first insulating layer 141a and electrically connecting the connection pad 122 and the first redistribution layer 142a to each other, a second insulating layer 141b disposed on the first insulating layer 141a, a second redistribution layer 142b disposed on the second insulating layer 141b, and a second connection via 143b penetrating through the second insulating layer 141b and connecting first redistribution layer 142a and the second redistribution layer 142b to each other. The connection member 140 may include a greater number of insulating layers, redistribution layers, and connection vias than illustrated in the drawings.

A material of the first insulating layer 141a and the second insulating layer 141b may be an insulating material. The insulating material may be a photoimageable dielectric (PID). In this case, a fine pitch may be introduced through a photo via, which is advantageous in a fine circuit and a high-density design. Thus, the tens to hundreds of connection pads 122 of the semiconductor chip 120 may be effectively redistributed. A boundary between the first insulating layer 141a and the second insulating layer 141b may be apparent or unapparent.

The first redistribution layer 142a and the second redistribution layer 142b may serve to redistribute the connection pad 122 of the semiconductor chip 120. The first redistribution layer 142a and the second redistribution layer 142b may be formed of a conductive material such as copper (Cu), aluminum (Al), silver (Ag), tin (Sn), gold (Au), nickel (Ni), lead (Pb), titanium (Ti), or alloys thereof. The first redistribution layer 142a and the second redistribution layer 142b may perform various functions depending on designs of corresponding layers. The first redistribution layer 142a and the second redistribution layer 142b may include ground (GND) patterns, power (PWR) patterns, signal (S) patterns, and the like. The signal (S) patterns may include various signals except for the ground (GND) patterns, the power (PWR) patterns, and the like, such as a data signal, and the like. The term "pattern" refers to a concept including a wiring and a pad.

The connection vias 143a and 143b electrically connect the redistribution layers 142a and 142, disposed on different layers to each other, and electrically connect the connection pad 122 of the semiconductor chip 120 and the first distribution layer 142a. In the case in which the semiconductor chip 120 is a bare die, the connection vias 143a and 143b may be in physical contact with the connection pad 122. Each of the connection vias 143a and 143b may be formed of a conductive material such as copper (Cu), aluminum (Al), silver (Ag), tin (Sn), gold (Au), nickel (Ni), lead (Pb), titanium (Ti), or alloys thereof. Each of the first connection via 143a and the second connection via 143b may be a via filled with a conductive material, or a via in which a conductive material is formed along a wall surface of a via. Each of the first connection via 143a and the second connection via 143b may have all shapes, known in the art, such as a tapered shape, a cylindrical shape, and the like.

The backside connection member 180, including the backside redistribution layer 182 and the backside via 183, may be disposed on the encapsulant 130. The backside redistribution layer 182 may be disposed on the encapsulant 130 and may be connected to the wiring layer 112 of the frame 110 by the backside via 183 penetrating through the encapsulant 130. The backside connection member 180 may be electrically connected to the connection pad 122 of the semiconductor chip 120 and/or the connection member 140. The backside connection member 180 may electrically connect a semiconductor chip, mounted on a package, or a semiconductor package to an underlying connection member 140. At least a portion of the backside redistribution layer 182 may be exposed upwardly through the second passivation layer 190 to connect the backside redistribution layer 182 to an overlying component. According to example embodiments, the backside redistribution layer 182 may have a plate shape on the semiconductor chip 120, and the backside via 183 may be in the form of a trench via or a line via having a predetermined length. In this case, since all propagation paths of electromagnetic waves are substantially closed, an electromagnetic interference (EMI) shielding effect may be further improved. The backside redistribution layer 182 and the backside via 183 may also include a conductive material such as copper (Cu), aluminum (Al), silver (Ag), tin (Sn), gold (Au), nickel (Ni), lead (Pb), titanium (Ti), or alloys thereof.

The adhesive layer 170 may be further disposed in the second region R2 on the encapsulant 130. The adhesive layer 170 may be disposed outside of the backside redistribution layer 182. A width of the adhesive layer 170 may be variously changed in example embodiments, and may be smaller than or equal to a width of the second region R2. The adhesive layer 170 may be disposed to protrude on a top surface of the encapsulant 130, but a shape of the adhesive layer 170 is not limited thereto. For example, according to example embodiments, the adhesive layer 170 may have at least a portion inserted or recessed into the encapsulant 130. The encapsulant 130 may be pressed below the adhesive layer 170 to have a relatively small thickness. At least one side surface of the adhesive layer 170 may be exposed through a side surface of the semiconductor substrate 100A, but exposure of the adhesive layer 170 is not limited thereto. As described above, the adhesive layer 170 may include an epoxy-based resin and may be, in detail, a no flow resin layer.

The first passivation layer 150 may protect the connection member 140 from external physical and chemical damage, and the like. The first passivation layer 150 may have an opening exposing at least a portion of the second redistribution layer 142b. Tens to thousands of openings may be formed in the first passivation layer 150. A material of the first passivation layer 150 is not limited. For example, the material of the first passivation layer 150 may be an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. The material of the first passivation layer 150 may be a solder resist. According to example embodiments, the first passivation layer 150 may be construed to be a component included as a portion of the connection member 140. A second passivation layer 190 may be formed on the backside connection member 180 to protect the backside connection member 180. The second passivation layer 190 may be disposed to cover at least a portion of the adhesive layer 170. The first passivation layer 150 and the second passivation layer 190 may include the same material to serve to control a coefficient of thermal expansion (CTE) as a symmetrical effect.

The underbump metal layer 160 may improve connection reliability of an electrical connection metal disposed on an underlying underbump metal layer 160 to improve board level reliability of the package 100A. The underbump metal layer 160 is connected to the second redistribution layer 142b of the connection member 140 exposed through the opening of the first passivation layer 150. The underbump metal layer 160 may be formed in the opening of the first passivation layer 150 by a known metallization method using a known conductive material, for example, a metal, and a forming method of the underbump metal layer 160 is not limited thereto.

FIGS. 11A to 11D are process diagrams illustrating an example of manufacturing a semiconductor package using the semiconductor package substrate of FIG. 10 according to an example embodiment.

Figure 11A:
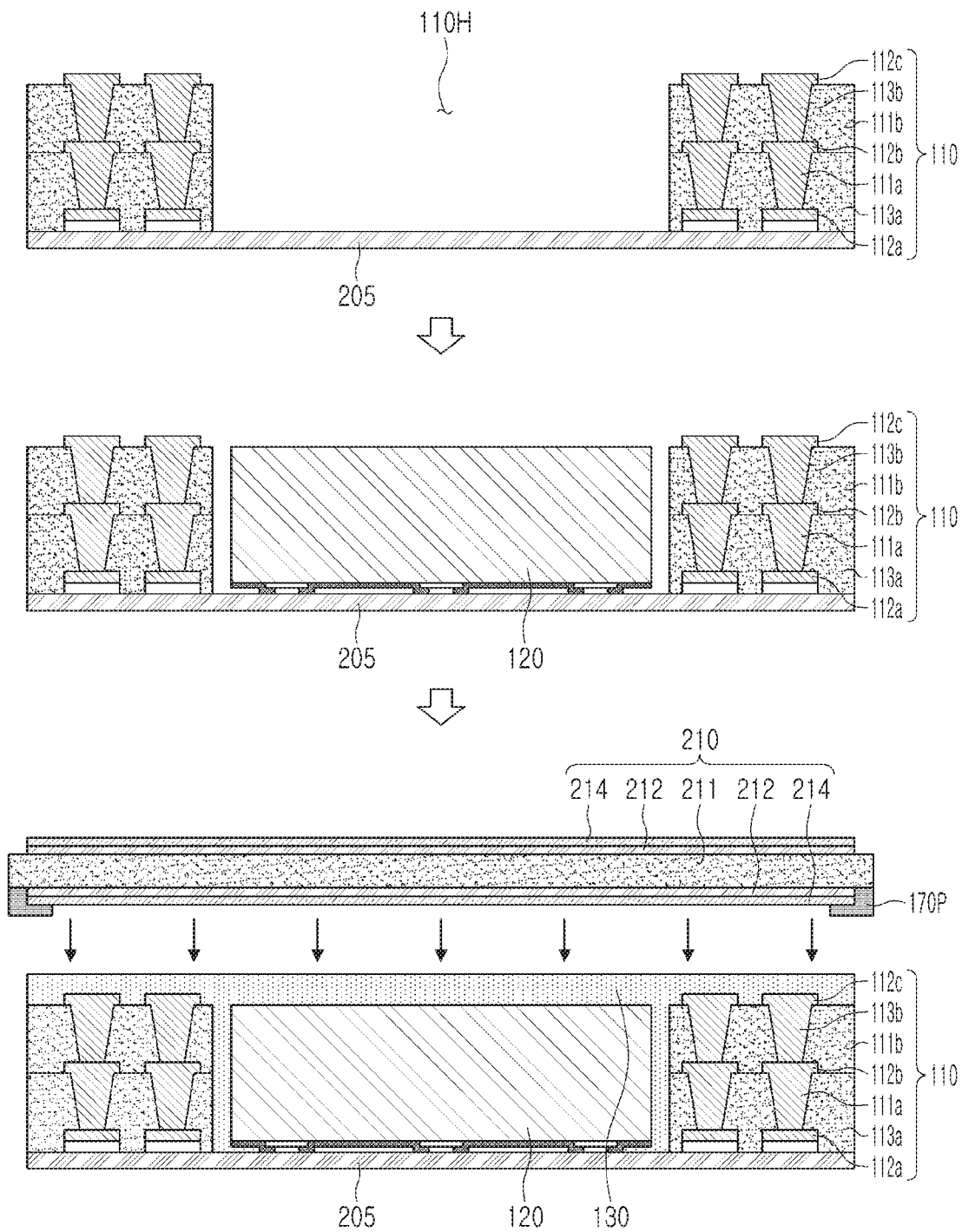
FIGS. 11A to 11D are process diagrams illustrating an example of manufacturing a semiconductor package using the semiconductor package substrate of FIG. 10 according to an example embodiment.

Referring to FIG. 11A, a through-portion 110H is formed to penetrate through top and bottom surfaces of the frame 110, and an adhesion film 205 is attached to one side of the frame 110. A semiconductor chip 120 is disposed in the through-portion 110H and then is encapsulated using an encapsulant 130. A carrier substrate 210 to be attached on a top surface of the encapsulant 130 is prepared. The carrier substrate 210 may include a core layer 211 and metal layers 212 and 214 formed on the core layer 211. The core layer 211 may be, for example, prepreg including an insulating resin, an inorganic filler, and a glass fiber. The metal layers 212 and 214 may include a metal such as copper (Cu), titanium (Ti), or the like. A surface treatment may be performed between the metal layers 212 and 214 to easily divide the metal layers 212 and 214. A release layer may be provided between the metal layers 212 and 214. The carrier substrate 210 may be a conventional detach core. The carrier substrate 210 may have a planar top surface, and an adhesive film 170P may be formed on the carrier substrate 210 to cover end portions of the metal films 212 and 214. The adhesive film 170P may be prepared through press working along the end portions of the metal film 212 and 214 in the form of a rectangular ring, and may be disposed in a region corresponding to a dummy region of a package substrate. The adhesive film 170P may serve to prevent separation between the metal layers 212 and 214 and to protect the end portions of the metal layers 212 and 214, and may also serve to attach the carrier substrate 210 to the encapsulant 130.

Figure 11B:
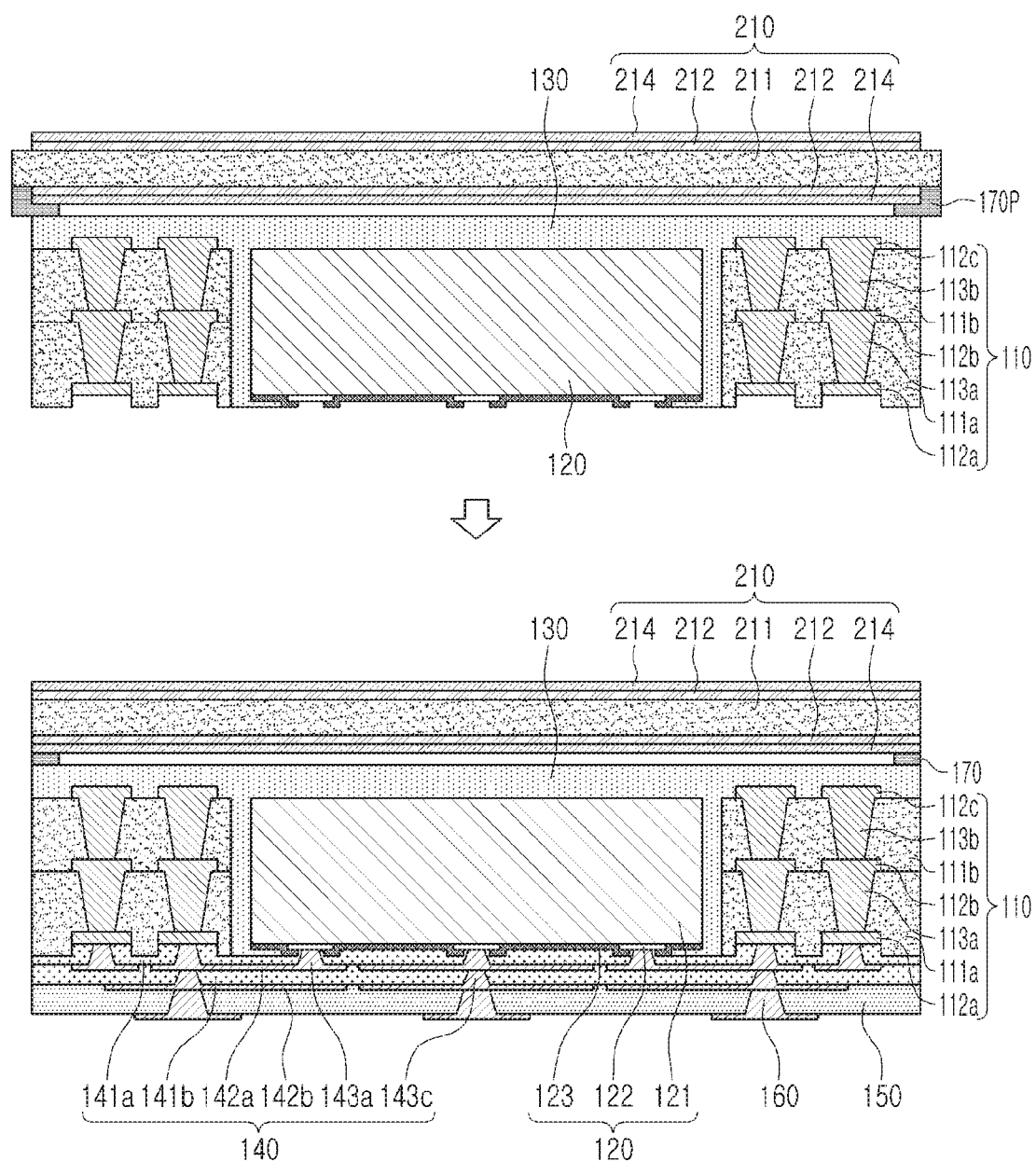

Referring to FIG. 11B, the carrier substrate 210 is attached to the encapsulant 130, and the adhesion film 205 is removed. A connection member 140 is formed below the semiconductor chip 120, and a first passive layer 150 is formed to cover the connection member 140. An opening is formed in the first passivation layer 150 to expose at least a portion of the second redistribution layer 142, and an underbump metal layer 160 is formed on the opening. However, the underbump metal layer 160 may be formed in a subsequent process. A singulation process may be performed to divide into unit first regions R1 at a panel level (see FIG. 9A). In this case, a portion of the carrier substrate 210 is removed from an end portion thereof.

Figure 11C:
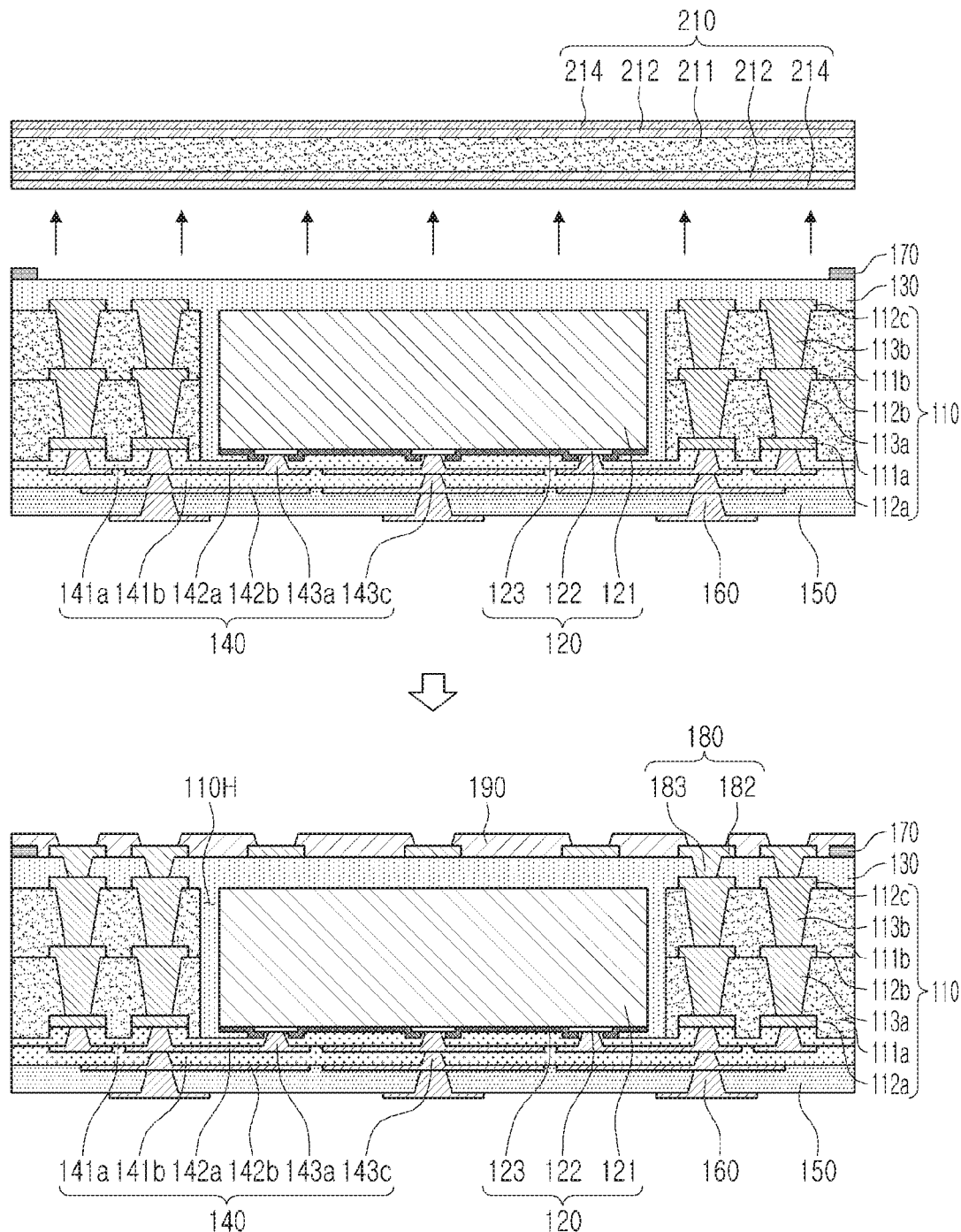

Referring to FIG. 11C, the carrier substrate 210 is removed from the top surface of the encapsulant 130. Even if the carrier substrate 210 is removed, the adhesive film 170P remains to form an adhesive layer 170. The semiconductor package according to the example embodiment may prevent a thickness of the encapsulant 130 from increasing, as compared to a case in which the entire carrier substrate 210 is covered with the same or similar resin material as the encapsulant 130 rather than the adhesive film 170P, and is then attached to the encapsulant 130 in such a manner that the resin material remains. Since the adhesive film 170P does not flow during the process of attaching the carrier substrate 210, the adhesive layer 170 may remain only in the dummy region. According to example embodiments, an etching process may be further performed to remove remaining metal layer after removal of the carrier substrate 210. After a via hole penetrating through the encapsulant 130, is formed on the encapsulant 130 from which the carrier substrate 210 is detached, a plating process is performed to form a backside connection member 180 including a backside via 183 and a backside redistribution layer 182 and to form a second passivation layer 190. As described above, since a thickness of the encapsulant 130 is significantly reduced, a thickness and a size of the via hole may also be significantly reduced to form the backside connection member 180 of a fine pattern.

Figure 11D:
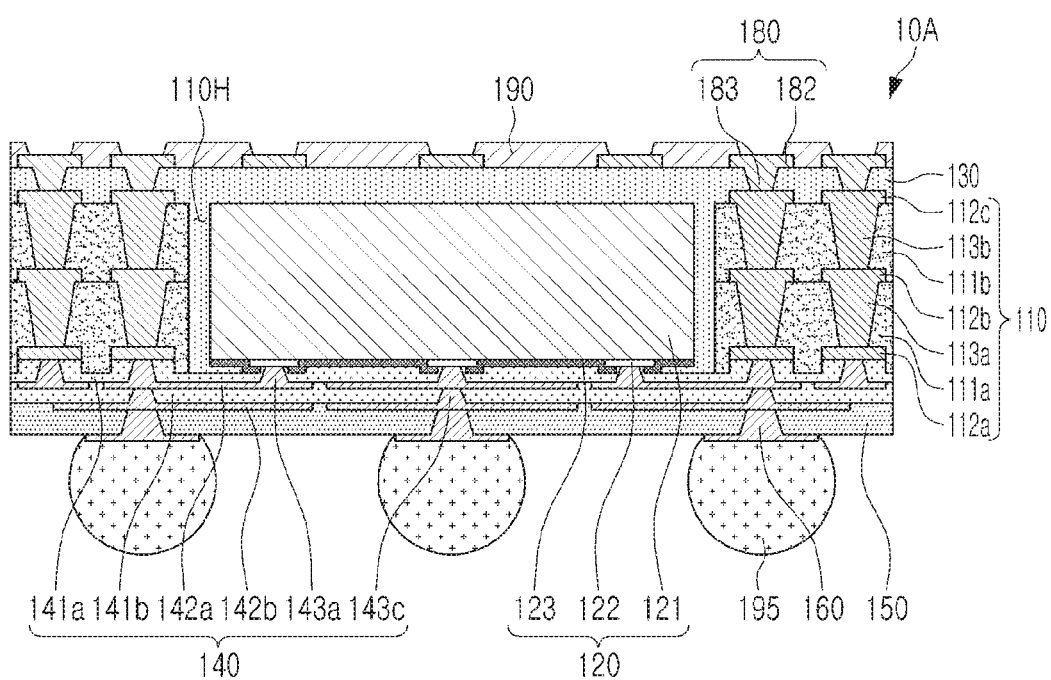

Referring to FIG. 11D, an electrical connection metal 195 is formed on the underbump metal layer 160, and a singulation process is performed in units of package regions to manufacture a semiconductor package 10A. According to example embodiments, the electrical connection metal 195 may not be formed, and subsequent processes may be performed as additional processes, as necessary. The singulation process may be performed on the package region to remove the adhesion layer 170 while removing the second region R2. Accordingly, the semiconductor package 10A may not include the adhesive layer 170.

The electrical connection metal 195 may physically and/or electrically connect the semiconductor package 100A to an external component. For example, the semiconductor package 100A may be mounted on a mainboard of an electronic device through the electrical connection metal 195. The electrical connection metal 195 may be formed of a conductive material, for example, a solder or the like, but is not limited thereto. The electrical connection metal 195 may be a land, a ball, a pin, or the like. The electrical connection metal 195 may be formed as a multilayer structure or a single-layer structure. When the electrical connection metal 195 is formed as a multilayer structure, the electrical connection metal 195 may include a copper pillar and a solder. When the electrical connection metal 195 is formed as a single-layer structure, the electrical connection metal 195 includes a tin-silver solder or copper. However, this is merely an example, and a structure and a material of the electrical connection metal 195 are not limited thereto. The number, an interval, a dispositional form, and the like, of the electrical connection metal 195 are not limited, but may be sufficiently modified. For example, several tens to several tens of thousands of electrical connection metals 195 may be provided. The number of electrical connection metals 195 may be greater than or smaller than several tens to several tens of thousands.

At least one of the electrical connection metals 195 may be disposed in a fan-out region. The fan-out region may be a region except for a region in which the semiconductor chip 120 is disposed. For example, the semiconductor package 100A may be a fan-out semiconductor package. The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LAG) package, or the like, the fan-out package may be manufactured to have a smaller thickness, and may have a lower price.

Figure 12:
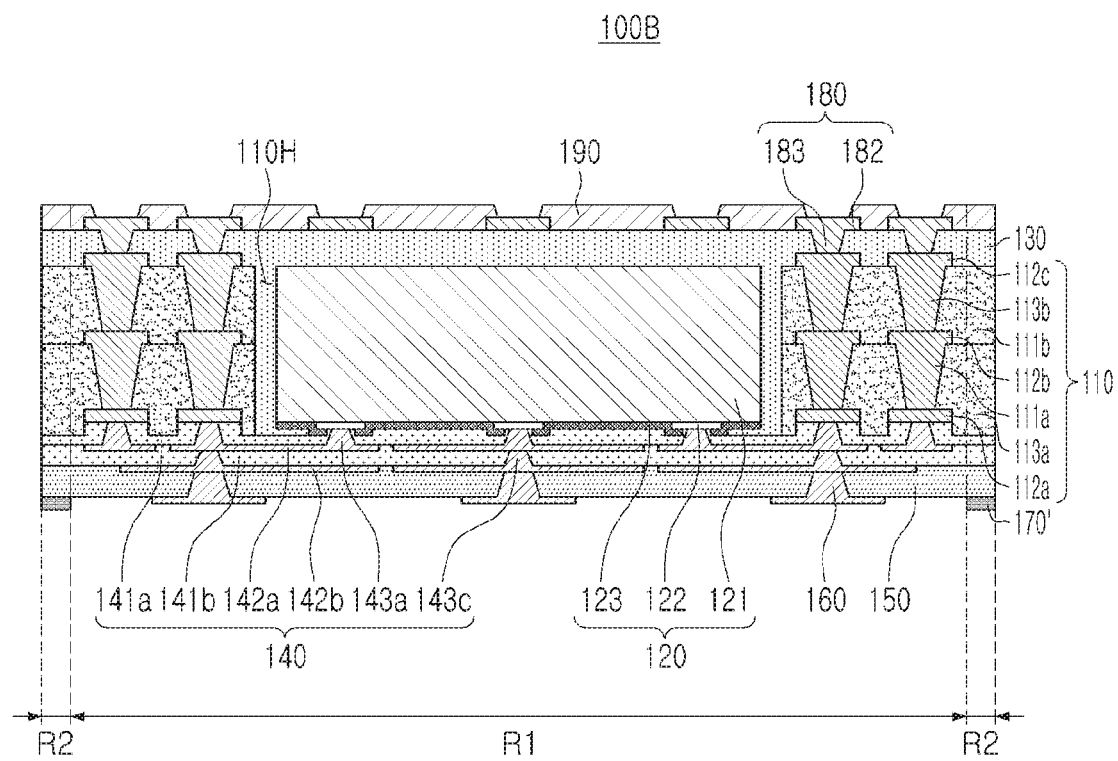
FIG. 12 is a schematic cross-sectional view illustrating a semiconductor package substrate according to an example embodiment.

FIG. 12 is a schematic cross-sectional view illustrating a semiconductor package substrate according to an example embodiment.

Referring to FIG. 12, a semiconductor package substrate 100B according to an example embodiment includes an adhesive layer 170' on a first passivation layer 150. The adhesive layer 170' is disposed on a bottom surface of a first passivation layer 150 in a second region R2 of the semiconductor package substrate 100B. Similarly to the adhesive layer 170 of FIG. 9A, the adhesive layer 170' may be disposed to have a shape of a rectangular ring surrounding a semiconductor chip 120 outside of the semiconductor chip 120 along a second region R2 on a plane, or to have a shape in which a plurality of rectangular rings are connected. The adhesive layer 170' may be disposed parallel to an underbump metal layer 160 at the same or similar level as the underbump metal layer 160. In an example embodiment, the semiconductor package substrate 100B may not include the first passivation layer 150. In this case, the adhesive layer 170' may be disposed on a lowermost surface of a connection member 140.

During a process of manufacturing the semiconductor package substrate 100B, after an encapsulant 130 and a connection member 140 are formed to cover the semiconductor chip 120, a carrier substrate may be used to prevent or reduce occurrence of a defect caused by warpage when a backside connection member 180 is formed. In the case in which ABF or the like is applied to an entire surface of the carrier substrate in order to attach the carrier substrate, and then the carrier substrate is attached to a bottom surface of the connection member 140, the ABF remains even after the carrier substrate is detached. Therefore, an additional process should be performed to remove the remaining ABF. In this case, for example, a laser drilling process or a cleaning process should be added which may increase process costs and time.

In the case of the semiconductor package 100B, similar to the adhesive layer 170, the adhesive layer 170' includes a no flow resin rather than ABF, and is attached to only the second region R2, corresponding to a dummy region. Thus, a process of attaching the carrier substrate may be simplified and pattern accuracy of the backside connection member 180 may be secured.

The other descriptions of the adhesive layer 170' are substantially the same as those of the adhesive layer 170 of the above-described semiconductor package substrate 100A or the like, and descriptions of the other components are substantially the same as those of the components of the above-describe semiconductor package substrate 100A. Therefore, the other descriptions of the adhesive layer 170' and the descriptions of the other components will be omitted herein.

FIGS. 13A to 13D are process diagrams illustrating an example of manufacturing a semiconductor package using the semiconductor package substrate of FIG. 12 according to an example embodiment.

Figure 13A:
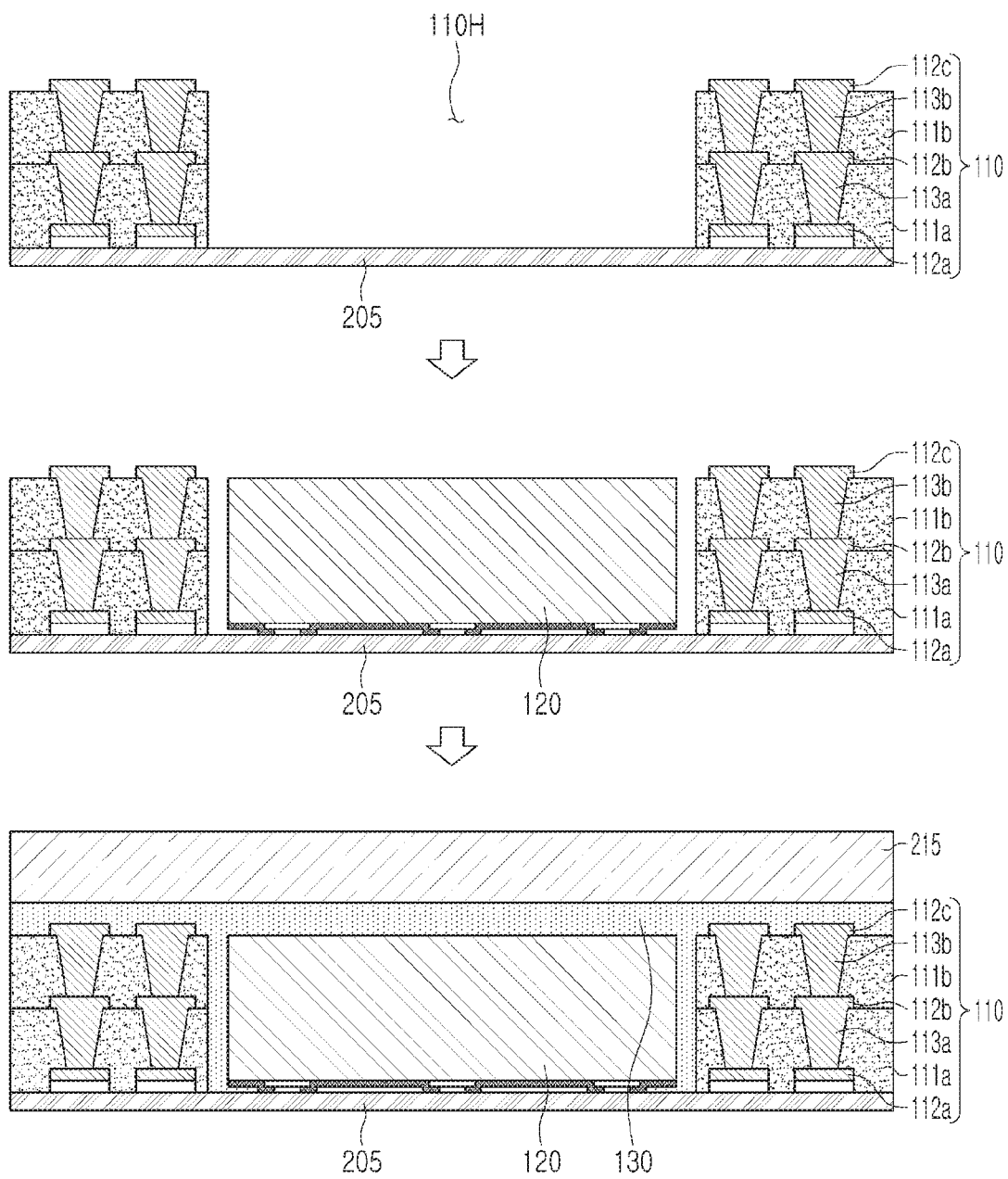
FIGS. 13A to 13D are process diagrams illustrating an example of manufacturing a semiconductor package using the semiconductor package substrate of FIG. 12 according to an example embodiment.

Referring to FIG. 13A, a through-portion 110H is formed to penetrate through a top surface and a bottom surface of a frame 110, and an adhesive film 205 is attached to one side of the frame 110. A semiconductor chip 120 is disposed in the through-portion 110H, and is encapsulated using an encapsulant 130. A first carrier substrate 215 is attached to a top surface of the encapsulant 130. The first carrier substrate 215 may be a conventional detached core, but is not limited thereto. According to example embodiments, as the first carrier substrate 215, the carrier substrate 210, described above with reference to FIG. 11, may be attached by an adhesive film 170P.

Figure 13B:
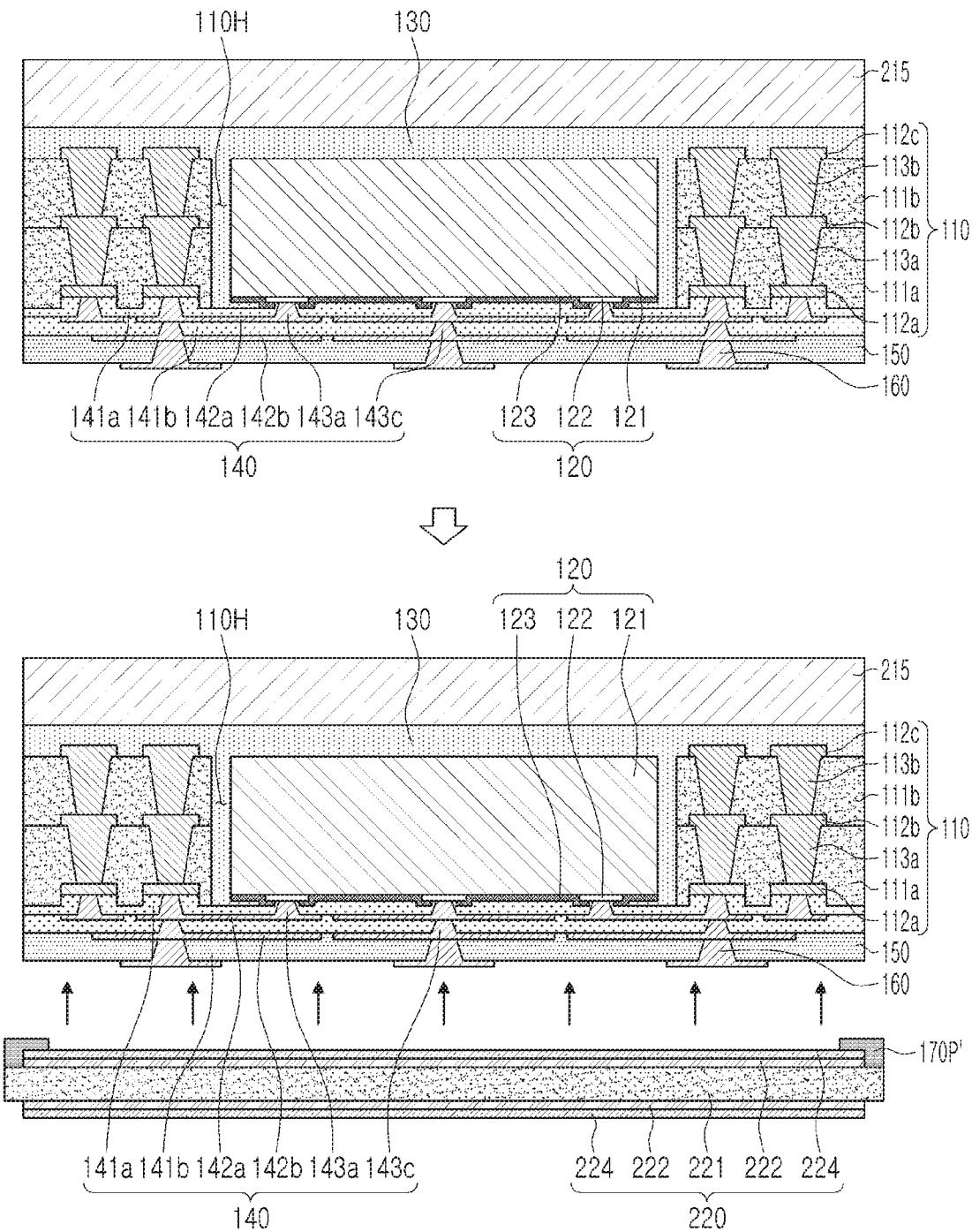

Referring to FIG. 13B, after an adhesion film 205 is removed, a connection member 140 is formed below the semiconductor chip 120, a first passivation layer 150 is formed to cover the connection member 140, an opening is formed in the first passivation layer 150 to expose at least a portion of a second redistribution layer 142b and an underbump metal layer 160 is formed on the opening. According to example embodiments, the underbump metal layer 160 may be formed in a subsequent process. A second carrier substrate 220, to be attached onto the first passivation layer 150 and the underbump metal layer 160 below the connection member 140, is prepared. The second carrier substrate 220 may include a core layer 221 and metal layers 222 and 224 formed on the core layer 221, but is not limited thereto. The core layer 221 may be, for example, prepreg including an insulating resin, an inorganic filler, and a glass filer. The metal layers 222 and 224 may include a metal such as copper (Cu), titanium (Ti), or the like. A surface treatment may be performed between the metal layers 222 and 224 to easily divide the metal layers 222 and 224. A release layer may be provided between the metal layers 222 and 224. The second carrier substrate 220 may be a conventional detach core. An adhesive film 170P' may be formed on the second carrier substrate 220 to cover the metal layers 212 and 214. The adhesive film 170P' may be prepared through press working along end portions/or portions of the metal film 212 and 214 in the form of a rectangular ring, and may be disposed in a region corresponding to a dummy region of a package substrate. The adhesive film 170P' may serve to prevent separation between the metal layers 222 and 224 and to protect the end portions of the metal layers 222 and 224, and may also serve to attach the second carrier substrate 220 to a lower portion of the connection member 140. The second carrier substrate 220 may be attached onto the underbump metal layer 160 below the connection member 140. However, according to example embodiments, the second carrier substrate 220 may be attached to a bottom surface of the connection member 140 or a bottom surface of the first passivation layer 150. The first carrier substrate 215 may be removed after or before attachment of the second carrier substrate 220.

Figure 13C:
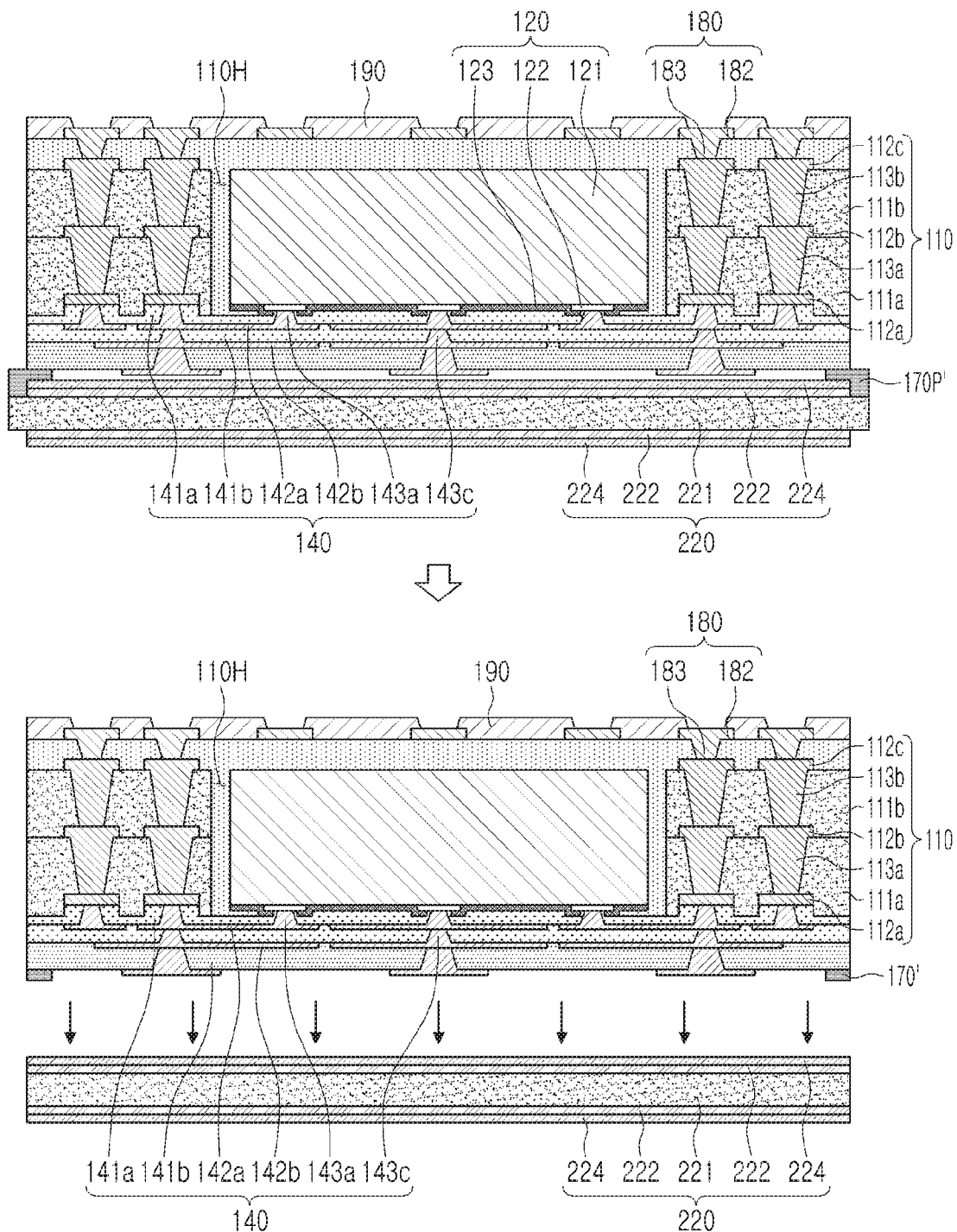

Referring to FIG. 13C, after a via hole penetrating through the encapsulant 130, is formed on the encapsulant 130 from which the first carrier substrate 215 is detached, a plating process may be performed to form a backside connection member, including a backside via 183 and a backside redistribution layer 182, and a second passivation layer 190. Next, the second carrier substrate 220 may be removed. Prior to removal of the second carrier substrate 220, a singulation process may be performed to divide into unit first regions R1 at a panel level (see FIG. 9A). In this case, a portion of the second carrier substrate 220 may be removed from an end portion thereof. However, according to example embodiments, the singulation process may be performed before another process, for example, prior to removal of the first carrier substrate 215. Even if the second carrier substrate 220 is removed, the adhesive film 170P' remains to form an adhesive layer 170'. In the semiconductor package according to the example embodiment, performing an operation of removing a residual material may be omitted to simplify a process, as compared in a case in which the entire second carrier substrate 220 is covered with a resin material such as ABF or the like rather than the adhesive film 170P', and then is attached and detached to allow a resin material to remain. Since the adhesive film 170P' does not flow during a process of attaching the second carrier substrate 220, the adhesive layer 170' may remain only in the dummy region. According to example embodiments, an etching process may be further performed to remove a metal layer remaining after removal of the second carrier substrate 220.

Figure 13D:
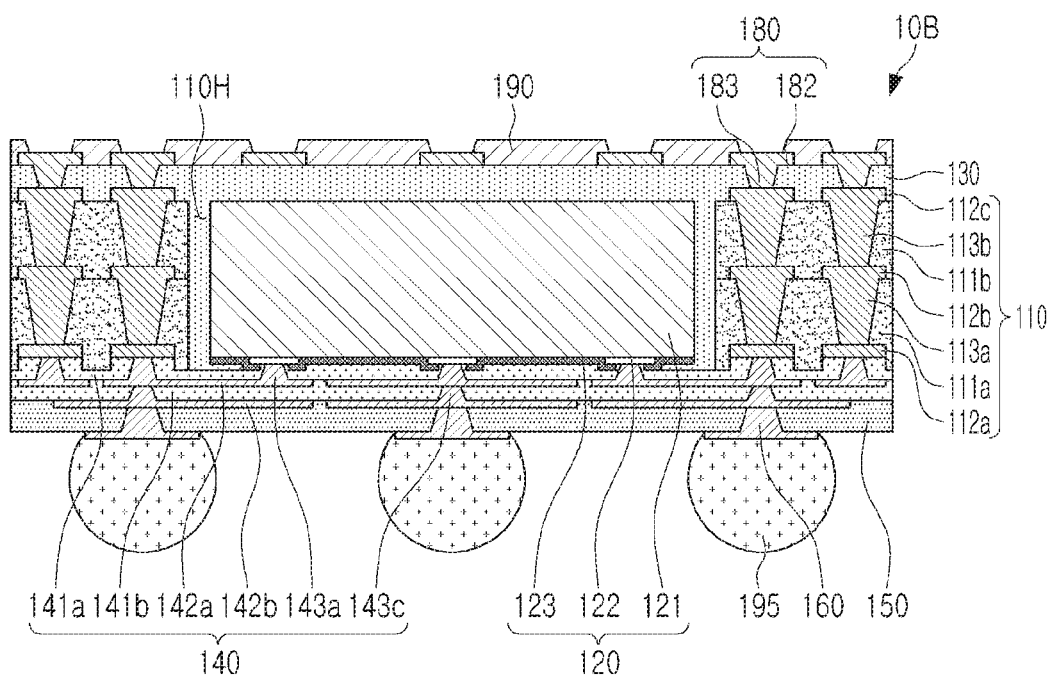

Referring to FIG. 13D, an electrical connection metal 195 is formed on the underbump metal layer 160 and a singulation process is performed in units of package regions to manufacture a semiconductor package 10B. According to an example embodiment, the electrical connection metal 195 may not be formed, and subsequent processes may be performed as additional processes, as necessary. Since the adhesive layer 170' may be removed while the second region R2 is removed by the singulation process performed in units of packages, the semiconductor package 10B may not include the adhesive layer 170'.

Figure 14:
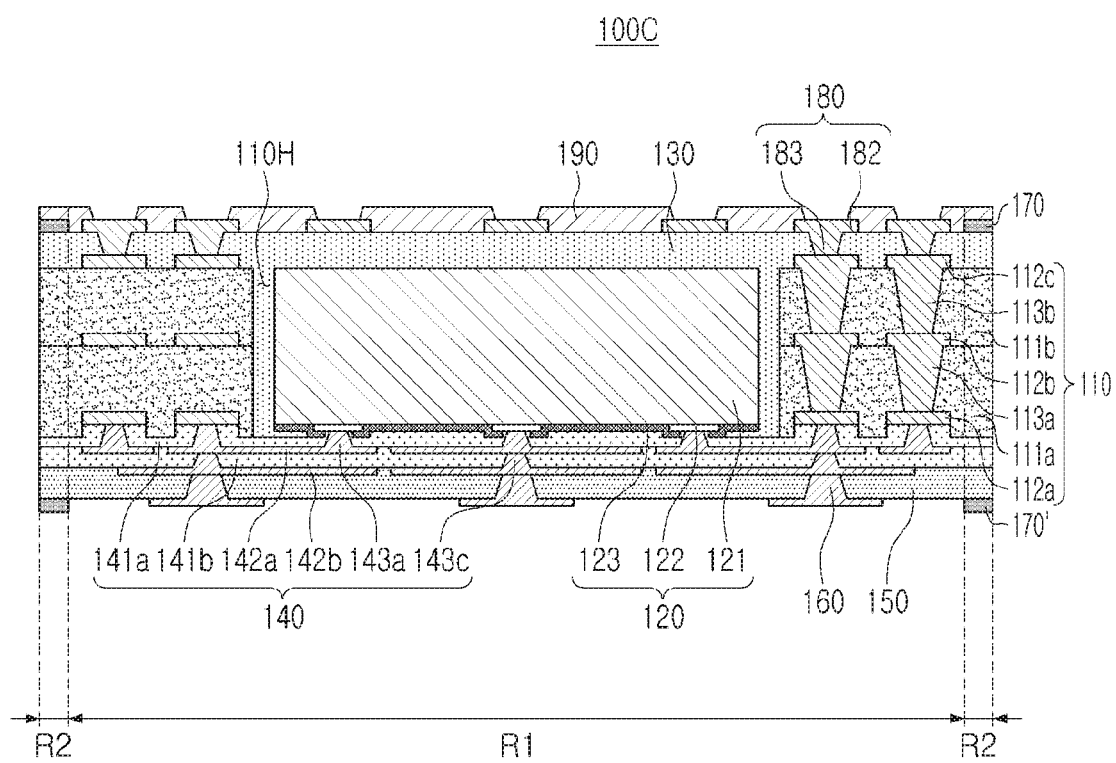
FIG. 14 is a schematic cross-sectional view illustrating a semiconductor package substrate according to an example embodiment.

FIG. 14 is a schematic cross-sectional view illustrating a semiconductor package substrate according to an example embodiment.

Referring to FIG. 14, a semiconductor package substrate 100C includes both the adhesive layer 170 on the encapsulant 130 of FIG. 10 and the adhesive layer 170' on the first passivation layer 150. For example, according to example embodiments, a semiconductor package substrate may include at least one of the adhesive layers 170 and 170', which may be determined according to the above-described manufacturing process. In the case in which a carrier substrate 210 is attached onto an encapsulant 130 using an adhesive film 170P, a semiconductor package substrate may include the adhesive layer 170. In the case in which a carrier substrate 220 is attached onto the first passivation layer 150 using the adhesive film 170P', a semiconductor package substrate may include the adhesive layer 170'. The two adhesive layers 170 and 170' may be formed of the same material, but materials of the adhesive layers 170 and 170' are not limited thereto, and may be different from each other.

The other descriptions of the adhesive layers 170 and 170' are substantially the same as those of the adhesive layer 170 and 170' of the above-described semiconductor package substrate 100A and 100B, or the like, and descriptions of the other components are substantially the same as those of the components of the above-describe semiconductor package substrate 100A. Therefore, the other descriptions of the adhesive layers 170 and 170' and the descriptions of the other components will be omitted herein.

Figure 15:
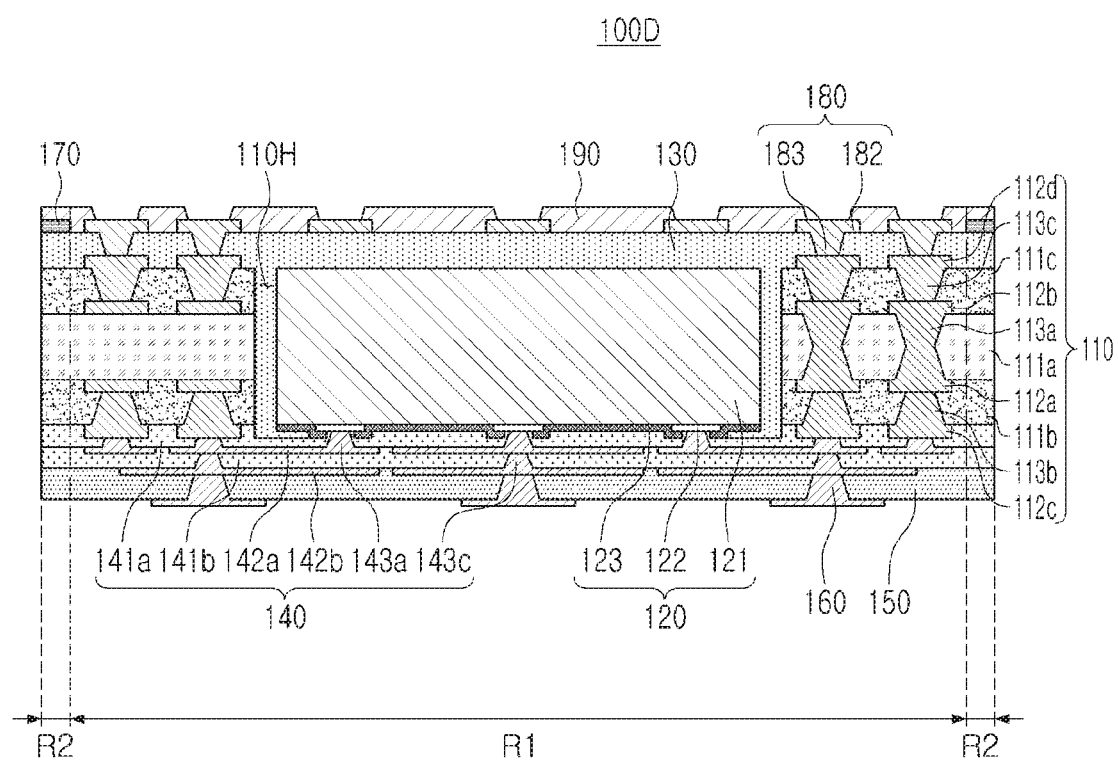
FIG. 15 is a schematic cross-sectional view illustrating a semiconductor package substrate according to an example embodiment.

FIG. 15 is a schematic cross-sectional view illustrating a semiconductor package substrate according to an example embodiment.

Referring to FIG. 15, a semiconductor package substrate 100D includes another type of frame 110. More specifically, the frame 110 includes a first insulating layer 111a, a first wiring layer 112a and a second wiring layer 112b respectively disposed on both surfaces of the first insulating layer 111a, a second insulating layer 111b and a third insulating layer 111c, respectively disposed on both surfaces of the first insulating layer 111a, respectively covering the first wiring layer 112a and the second wiring layer 112b, a third wiring layer 112c disposed on a side of the second insulating layer 111b opposing a side in which the first wiring layer 112a is embedded, a fourth wiring layer 112d disposed on a side opposing a side of the third insulating layer 111c in which the second wiring layer 112b is embedded, a first wiring via layer 113a penetrating through the first insulating layer 111a and electrically connecting the first wiring layer 112a and the second wiring layer 112b to each other, a second wiring via layer 113b penetrating through the second insulating layer 111b and electrically connecting the first wiring layer 112a and the third wiring layer 113c to each other, and a third wiring via layer 113c penetrating through the third insulating layer 111c and electrically connecting the second wiring layer 112b and fourth wiring layer 112d. Since the frame 110 includes a greater number of wiring layers 112a, 112b, 112c, and 112d, the connection member 140 may be further simplified.

The first insulating layer 111a may have a thickness greater than a thickness of each of the second insulating layer 111b and the third insulating layer 111c. The first insulating layer 111a may have a relatively greater thickness to maintain rigidity, and the second insulating layer 111b and the third insulating layer 111c may be introduced to form a greater number of wiring layers 112c and 112d. A wiring via of the first wiring via layer 113a penetrating through the first insulating layer 111a may have an average diameter and a height greater than an average diameter and a height of a wiring via of each of the second wiring via layer 113b and the third wiring via layer 113c penetrating through the second insulating layer 111b and the third insulating layer 111c. The first wiring via of the first wiring via layer 113a has a hourglass shape or a cylindrical shape, while the second wiring via layer 113b and the third wiring via layer 113c may have shapes tapered in opposite directions. Each of the first wiring layer 112a, the second wiring layer 112b, the third wiring layer 112c, and the fourth wiring layer 112d may be greater than a thickness of each of the first redistribution layers 142. As necessary, a metal layer may be further disposed on a wall surface of a through-portion 110H of the frame 110. The metal layer may be formed to cover the entire wall surface. The metal layer may include a metal material such as copper (Cu). An electromagnetic interference (EMI) shielding effect and a heat radiation effect may be improved through the metal layer.

Descriptions of the other components are substantially the same as those of the components of the above-describe semiconductor package substrate 100A. Therefore, the descriptions of the other components will be omitted herein. In addition, the above-described feature configuration of the semiconductor package 100D may be applied to the semiconductor packages 100B and 100C according to example embodiments.

Figure 16:
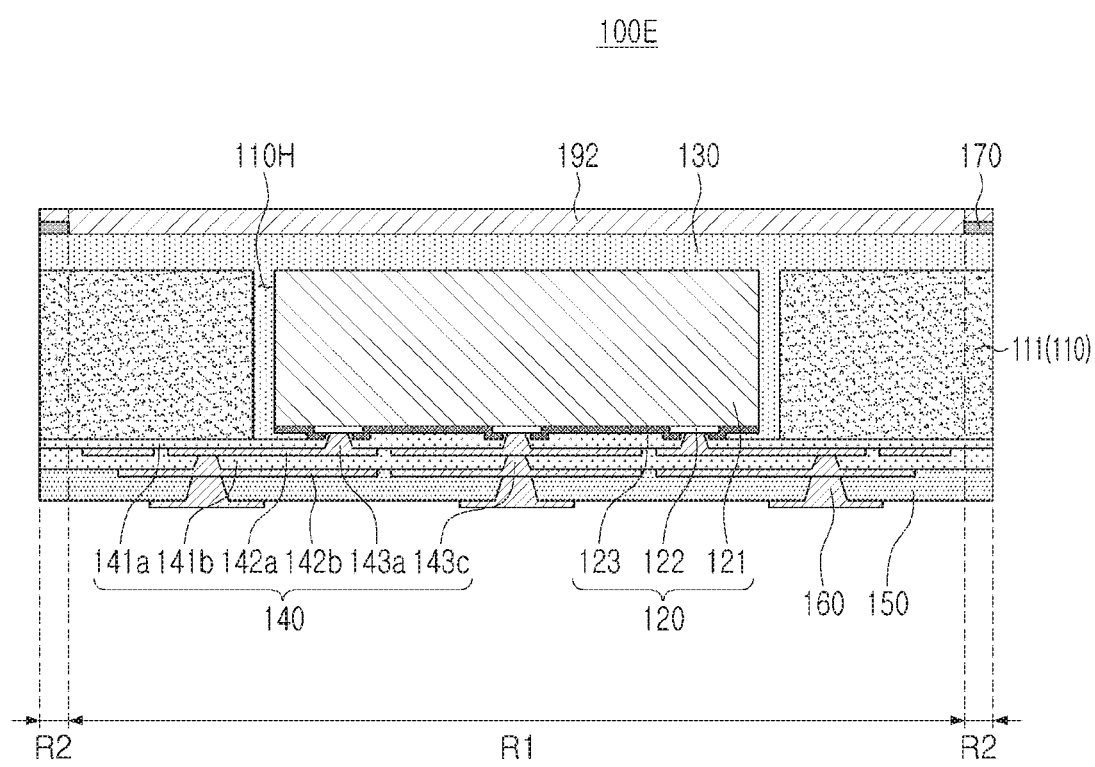
FIG. 16 is a schematic cross-sectional view illustrating a semiconductor package substrate according to an example embodiment.

FIG. 16 is a schematic cross-sectional view illustrating a semiconductor package substrate according to an example embodiment.

Referring to FIG. 16, a semiconductor package substrate 100E according to an example embodiment may include a frame 110 including only an insulating layer 111. A heat radiating member 192, rather than the backside connection member 180, may be disposed on an encapsulant 130. The heat radiating member 192 may be disposed on at least a portion of the encapsulant 130, and an adhesive may be interposed between the heat radiating member 192 and the encapsulant 130. The heat radiating member 192 may be disposed to cover an adhesive layer 170 in a second region R2. Heat, generated from a semiconductor chip 120, may be released outwardly through the overlying heat radiating member 192. The heat radiating member 192 may include a material having improved heat conductivity, for example, a conductive material such as copper (Cu), aluminum (Al), silver (Ag), tin (Sn), gold (Au), nickel (Ni), lead (Pb), titanium (Ti), or alloys thereof.

Descriptions of the other components are substantially the same as those of the components of the above-describe semiconductor package substrate 100A. Therefore, the descriptions of the other components will be omitted herein. In addition, the above-described feature configuration of the semiconductor package 100E may be applied to the semiconductor package 100B according to another embodiment.

As set forth above, according to example embodiments, a semiconductor package substrate, in which a thickness of an encapsulant may be significantly reduced to form a backside redistribution layer to have a fine pattern, and a method of manufacturing a semiconductor package using the semiconductor package substrate may be provided.

In the present disclosure, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to a direction opposite to the direction toward a mounting surface. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and does not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another exemplary embodiment. However, example embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present disclosure as defined by the appended claims.

What is claimed is:
1. A semiconductor package substrate comprising:
a semiconductor chip comprising a connection pad;
an encapsulant encapsulating at least a portion of the semiconductor chip;
a connection member disposed on the semiconductor chip and a bottom surface of the encapsulant, the connection member comprising a redistribution layer that is electrically connected to the connection pad;
a first passivation layer disposed on the connection member; and an adhesive layer disposed on a top surface of the encapsulant in a region outside of the semiconductor chip.

2. The semiconductor package substrate of claim 1, wherein the semiconductor package substrate comprises a first region and a second region,
wherein the semiconductor chip is disposed in the first region, and the second region is a dummy region, and
wherein the adhesive layer is disposed in the second region.

3. The semiconductor package substrate of claim 2, wherein the second region has a shape of at least one square ring surrounding the first region, and
wherein the adhesive layer is disposed in the second region and has a rectangular ring shape.

4. The semiconductor package substrate of claim 1, wherein the adhesive layer is a no flow resin (NFR) layer.

5. The semiconductor package substrate of claim 1, further comprising:
a second passivation layer covering the adhesive layer that is disposed on the top surface of the encapsulant.

6. The semiconductor package substrate of claim 1, further comprising:
a backside redistribution layer disposed on a second surface of the semiconductor chip opposing a first surface of the semiconductor chip on which the connection member is disposed, the backside redistribution layer being electrically connected to the connection pad,
wherein the adhesive layer is disposed parallel to the backside redistribution layer on the top surface of the encapsulant.

7. The semiconductor package substrate of claim 1, further comprising:
an underbump metal layer disposed on the connection member,
wherein the adhesive layer is disposed parallel to the underbump metal layer on the bottom surface of the first passivation layer.

8. The semiconductor package substrate of claim 1, further comprising:
a frame comprising a through-portion,
wherein the semiconductor chip is disposed in the through-portion, and the encapsulant fills at least a portion of the through-portion.

9. The semiconductor package substrate of claim 2, wherein
the adhesive layer is disposed on the top surface of the encapsulant and the bottom surface of the first passivation layer.

10. The semiconductor package substrate of claim 7, further comprising an electrical connection metal disposed on the underbump metal layer,
wherein a portion of the electrical connection metal is disposed in the region outside of the semiconductor chip.

11. The semiconductor package substrate of claim 6, further comprising:
a second passivation layer covering the adhesive layer that is disposed on the top surface of the encapsulant and a portion of the backside redistribution layer.

12. The semiconductor package substrate of claim 1, wherein the adhesive layer is disposed so as not to overlap with the semiconductor chip in a vertical direction.

13. The semiconductor package substrate of claim 1, wherein the adhesive layer includes an epoxy-based resin.

14. A semiconductor package substrate comprising:
a semiconductor chip comprising a connection pad;
an encapsulant encapsulating at least a portion of the semiconductor chip;
a connection member disposed on the semiconductor chip and the encapsulant, the connection member comprising a redistribution layer that is electrically connected to the connection pad;
a first passivation layer disposed on the connection member; and
an adhesive layer disposed on at least one of a top surface of the encapsulant and a bottom surface of the first passivation layer in a region outside of the semiconductor chip;
a frame comprising a through-portion, the semiconductor chip being disposed in the through-portion, and the encapsulant filling at least a portion of the through-portion,
wherein the frame comprises:
a first insulating layer disposed in contact with a first surface of the connection member
a first wiring layer disposed in contact with the first surface of the connection member and embedded in the first insulating layer,
a second wiring layer disposed on a side of the first insulating layer opposing a side in which the first wiring layer is embedded,
a second insulating layer disposed on the side of the first insulating layer opposing the side in which the first wiring layer is embedded, the second insulating layer covering at least a portion of the second wiring layer, and
a third wiring layer disposed on a side of the second insulating layer opposing a side in which the second wiring layer is embedded, and
wherein a surface of the first insulating layer, disposed in contact with the first surface of the connection member, has a step structure with respect to a surface of the first wiring layer disposed in contact with the first surface of the connection member.

15. The semiconductor package substrate of claim 14, wherein the frame further comprises:
a first wiring via layer disposed between the first wiring layer and the second wiring layer; and
a second wiring via layer disposed between the second wiring layer and the third wiring layer, and
wherein each of the first wiring via layer and the second wiring via layer have a tapered shape.

16. The semiconductor package substrate of claim 14, wherein the adhesive layer is disposed so as not to overlap with the semiconductor chip in a vertical direction.

17. A semiconductor package substrate comprising:
a semiconductor chip comprising a connection pad;
an encapsulant encapsulating at least a portion of the semiconductor chip;
a connection member disposed on the semiconductor chip and the encapsulant, the connection member comprising a redistribution layer that is electrically connected to the connection pad;
a first passivation layer disposed on the connection member; and
an adhesive layer disposed on at least one of a top surface of the encapsulant and a bottom surface of the first passivation layer in a region outside of the semiconductor chip;
a frame comprising a through-portion, the semiconductor chip being disposed in the through-portion, and the encapsulant filling at least a portion of the through-portion, wherein the frame comprises:
- a first insulating layer,
- a first wiring layer and a second wiring layer respectively disposed on opposing surfaces of the first insulating layer,
- a second insulating layer and a third insulating layer respectively disposed on the opposing surfaces of the first insulating layer, and respectively covering at least a portion of the first wiring layer and at least a portion of the second wiring layer,
- a third wiring layer disposed on a side of the second insulating layer opposing a side in which the first wiring layer is embedded, and
- a fourth wiring layer disposed on a side of the third insulating layer opposing a side in which the second wiring layer is embedded, and
- wherein a thickness of the first insulating layer is greater than a thickness of each of the second insulating layer and the third insulating layer.

18. The semiconductor package substrate of claim 17, wherein the adhesive layer is disposed so as not to overlap with the semiconductor chip in a vertical direction.

* * * * *